United States Patent
Yokoyama

(10) Patent No.: US 7,720,389 B2
(45) Date of Patent: May 18, 2010

(54) OPTICAL INTEGRATED CIRCUIT APPARATUS

(75) Inventor: Shin Yokoyama, Hiroshima (JP)

(73) Assignee: Hiroshima University, Higashihiroshima-shi, Hiroshima (JP)

( * ) Notice: Subject to any disclaimer, the term of this patent is extended or adjusted under 35 U.S.C. 154(b) by 0 days.

(21) Appl. No.: 12/393,458

(22) Filed: Feb. 26, 2009

(65) Prior Publication Data

US 2009/0324239 A1  Dec. 31, 2009

(30) Foreign Application Priority Data

Feb. 27, 2008  (JP)  ............................... 2008-045785

(51) Int. Cl.
*H04B 10/00* (2006.01)
(52) U.S. Cl. ...................................... 398/139; 398/138
(58) Field of Classification Search ......... 398/135–139, 398/164; 385/14
See application file for complete search history.

(56) References Cited

U.S. PATENT DOCUMENTS

| | | | |
|---|---|---|---|
| 6,634,812 B2 * | 10/2003 | Ozeki et al. ................. | 398/164 |
| 7,366,368 B2 * | 4/2008 | Morrow et al. ................ | 385/15 |
| 2002/0196502 A1 | 12/2002 | Perner | |
| 2007/0258714 A1 * | 11/2007 | Little et al. .................... | 398/76 |
| 2009/0103929 A1 * | 4/2009 | Binkert et al. ................ | 398/154 |

FOREIGN PATENT DOCUMENTS

| | | |
|---|---|---|
| JP | 61-070509 | 4/1986 |
| JP | 04-302176 | 10/1992 |
| JP | 05-067770 | 3/1993 |
| JP | 11-205232 | 7/1999 |
| JP | 2001-237411 | 8/2001 |
| JP | 2001-284635 | 10/2001 |
| JP | 2002-124661 | 4/2002 |
| JP | 2004-046004 | 2/2004 |
| JP | 2007-013893 | 1/2007 |

OTHER PUBLICATIONS

Notification of Reasons for Refusal (First Office Action) for Japanese Patent Application No. 2008-045785, dated Jun. 24, 2008. (with English Translation).

* cited by examiner

*Primary Examiner*—Quan-Zhen Wang
(74) *Attorney, Agent, or Firm*—Foley & Lardner LLP

(57) ABSTRACT

Optical waveguides and optical transmission/reception units are placed on one principal plane of a semiconductor substrate. A light source is placed on one end surface of the semiconductor substrate and guides generated light to the optical waveguides. In the optical transmission/reception units, each of optical resonant members optically resonates with partial light of one of light beams propagating in the optical waveguides and emits the partial light into an optical transmission member if voltage is applied thereto. In the optical transmission/reception units, each of another optical resonant members optically resonates with light propagating in the optical transmission member and emits the resonated light into a photodetector unit if voltage is applied thereto.

12 Claims, 18 Drawing Sheets

OPTICAL INTEGRATED CIRCUIT APPARATUS

CROSS-REFERENCE TO RELATED APPLICATION

This application claims priority to Japanese Patent Application No. 2008-045785 filed on Feb. 27, 2008, which is hereby incorporated by reference in its entirety.

BACKGROUND

1. Field

The present disclosure relates to an optical integrated circuit apparatus, and, more specifically, it relates to an optical integrated circuit apparatus that allows direct optical communication among arbitrary multiple optical transmission/reception units or an optical integrated circuit apparatus that allows arbitrary optical communication among multiple optical transmission/reception units at a same time.

2. Description of the Related Art

Conventionally, an opto-electronic integrated circuit apparatus has been known (Japanese Unexamined Patent Application Publication No. 5-67770). The opto-electronic integrated circuit apparatus includes an optical wiring substrate, multiple opto-electronic integrated circuit (IC) chips, and multiple optical waveguides.

The multiple opto-electronic IC chips are discretely placed on the optical wiring substrate. Then, each of the multiple optical waveguides is placed between adjacent two opto-electronic IC chips.

Then, the adjacent two opto-electronic IC chips transmit and receive optical signals through the optical waveguide placed there between.

SUMMARY

In the conventional opto-electronic integrated circuit apparatus, because each opto-electronic IC chip only connects to the adjacent opto-electronic IC chip through the optical waveguide, direct optical communication is difficult between the two arbitrary opto-electronic IC chips, which is a problem.

In the conventional opto-electronic integrated circuit apparatus, optical communication is allowed between arbitrary opto-electronic IC chips in time-series manner by switching the optical waveguides via an optical switch. However, optical communication is difficult between arbitrary opto-electronic IC chips at a same time, which is another problem.

Representative embodiments provide an optical integrated circuit apparatus that allows two arbitrary optical transmission/reception units to directly communicate.

Representative embodiments also provide an optical integrated circuit apparatus that allows arbitrary two optical transmission/reception units to communicate with each other at a same time.

According to an aspect of the representative embodiment, an optical integrated circuit apparatus includes an optical transmission member and a plurality of optical transmission/reception units. The optical transmission member transmits light. The plurality of optical transmission/reception units transmit and receive signals mutually by using the optical transmission member as a shared optical transmission path.

Preferably, the plurality of optical transmission/reception units transmit and receive signals mutually by transmitting light beams with mutually different wavelengths into the optical transmission member.

Preferably, the optical integrated circuit apparatus further includes an optical waveguide. The optical waveguide may propagate light emitted from a light source. Each of the plurality of optical transmission/reception units may have a photodetector unit and an optical switch member. The photodetector unit may detect light in the optical transmission member. The optical switch member may guide light in the optical waveguide to the optical transmission member and guide light in the optical transmission member to the photodetector unit.

Preferably, the light emitted from the light source contains multiple light beams having multiple discrete wavelengths or continuous wavelengths in a certain range. The optical switch member may have first and second optical resonant members. The first optical resonant member may guide one light beam having an arbitrary one wavelength among multiple light beams included in the light propagating in the optical waveguide from the optical waveguide to the optical transmission member with optical resonance if any of voltage, a magnetic field and heat is applied. The second optical resonant member may guide light propagating in the optical transmission member to the photodetector unit with optical resonance if any of voltage, a magnetic field and heat is applied.

Preferably, the second optical resonant member has first and second light incident members. The first light incident member may have a first light incident window through which light propagating in the optical transmission member impinges. The second light incident member may have a second light incident window through which light propagating in the optical transmission member impinges. The position of the first light incident window may be at a position resulting from the rotation of the position of the second light incident window by approximately 90 degrees.

Preferably, each of the plurality of optical transmission/reception units further has a signal processing circuit. The signal processing circuit may transmit a signal through the optical transmission member in response to the application and non-application of any of voltage, a magnetic field and heat to the first optical resonant member and receive a signal through the optical transmission member in response to the application and non-application of any of voltage, a magnetic field and heat to the second optical resonant member.

Preferably, the optical transmission member has a planer shape. The plurality of optical transmission/reception units may be placed closely to an arbitrary surface of the optical transmission member.

Preferably, the optical waveguide is provided on one principal plane of a semiconductor substrate. The photodetector unit may be provided on one principal plane of the semiconductor substrate away from the optical waveguide. The first optical resonant member may be provided on the optical waveguide in contact with the optical waveguide and may be placed closely to the optical transmission member. The second optical resonant member may be provided on the photodetector unit in contact with the photodetector unit and may be placed closely to the optical transmission member.

Preferably, each of the first and second optical resonant members contains an electro-optic material, a magneto-optical material, a thermo-optic material or a material that varies in optical refractive index in accordance with electricity, magnet or a temperature.

Preferably, each of the first and second optical resonant members has a ring-shape.

Preferably, each of the first and second optical resonant members contains any of $(Ba,Sr)TiO_3$, $LiNbO_3$, $Pb(Zr,Ti)O_3$, $LiTaO_3$, $BaTiO_3$, $K(Ta,Nb)O_3$, $ZnO$, $ADP(NH_4H_2PO_4)$, KDP($KH_2PO_4$), YIG($Y_3Fe_5O_{12}$), BIG($Bi_3F_5O_{12}$), $GdPr_2F_5O_{12}$, MnBi, GaAs, Ge and Si.

Preferably, the optical transmission member contains a transparent member having a higher refractive index than that of the air.

Preferably, the optical transmission member contains any of SiN, $SiO_2$, SiON, a resist and a plastic.

According to another aspect of the representative embodiments, an optical integrated circuit apparatus includes an optical transmission member and a semiconductor substrate. The optical transmission member transmits light. The semiconductor substrate is placed closely to the optical transmission member. The semiconductor substrate has i (where i is a positive integer) optical waveguides, i first optical resonant member groups, i photodetector unit groups, i second optical resonant member groups and i signal processing circuit groups. The i optical waveguides are provided on one principal plane of the optical transmission member side propagate light from a light source. The i first optical resonant member groups are provided for the i optical waveguides, and each of the i first optical resonant member groups is fabricated on one optical waveguide in contact with the one optical waveguide. The i photodetector unit groups provided for the i optical waveguides. The i second optical resonant member groups are provided for the i optical waveguides, and each of the i second optical resonant member groups is provided on one photodetector unit group in contact with the one photodetector unit group. The i signal processing circuit groups are provided for the i optical waveguides. Each of the i first optical resonant member groups has j (where j is an integer equal to or higher than 2) first optical resonant members. Each of the I photodetector unit groups has j photodetector units. Each of the i second optical resonant members has j second optical resonant members. Each of the i signal processing circuit groups has j signal processing circuits. Each of the j first optical resonant member guides a light beam with a wavelength that optically resonates in the light propagating in the optical waveguide to the optical transmission member in response to the application of any of voltage, a magnetic field and heat. Each of the j second optical resonant member guides a light beam with a wavelength that optically resonates in the light propagating in the optical transmission member to the photodetector unit in response to the application of any of voltage, a magnetic field and heat. Each of the j photodetector units detects light guided by the second optical resonant member. Each of the j signal processing circuits transmits a signal in response to the application and non-application of any of voltage, a magnetic field and heat to the first optical resonant member and processes a detection signal detected by the photodetector unit in accordance with the application and non-application of any of voltage, a magnetic field and heat to the second optical resonant member.

In the representative embodiments, the transmission/reception of signals is performed by using an optical transmission member as a shared optical transmission path.

Therefore, the representative embodiments allow arbitrary two optical transmission/reception units to directly communicate.

In the representative embodiments, different wavelengths of light are used among a plurality of optical transmission/reception units for transmission/reception.

Therefore, the representative embodiments allow two arbitrary optical transmission/reception units to communicate with each other at the same time.

DESCRIPTION OF REPRESENTATIVE EMBODIMENTS

Figure 1:
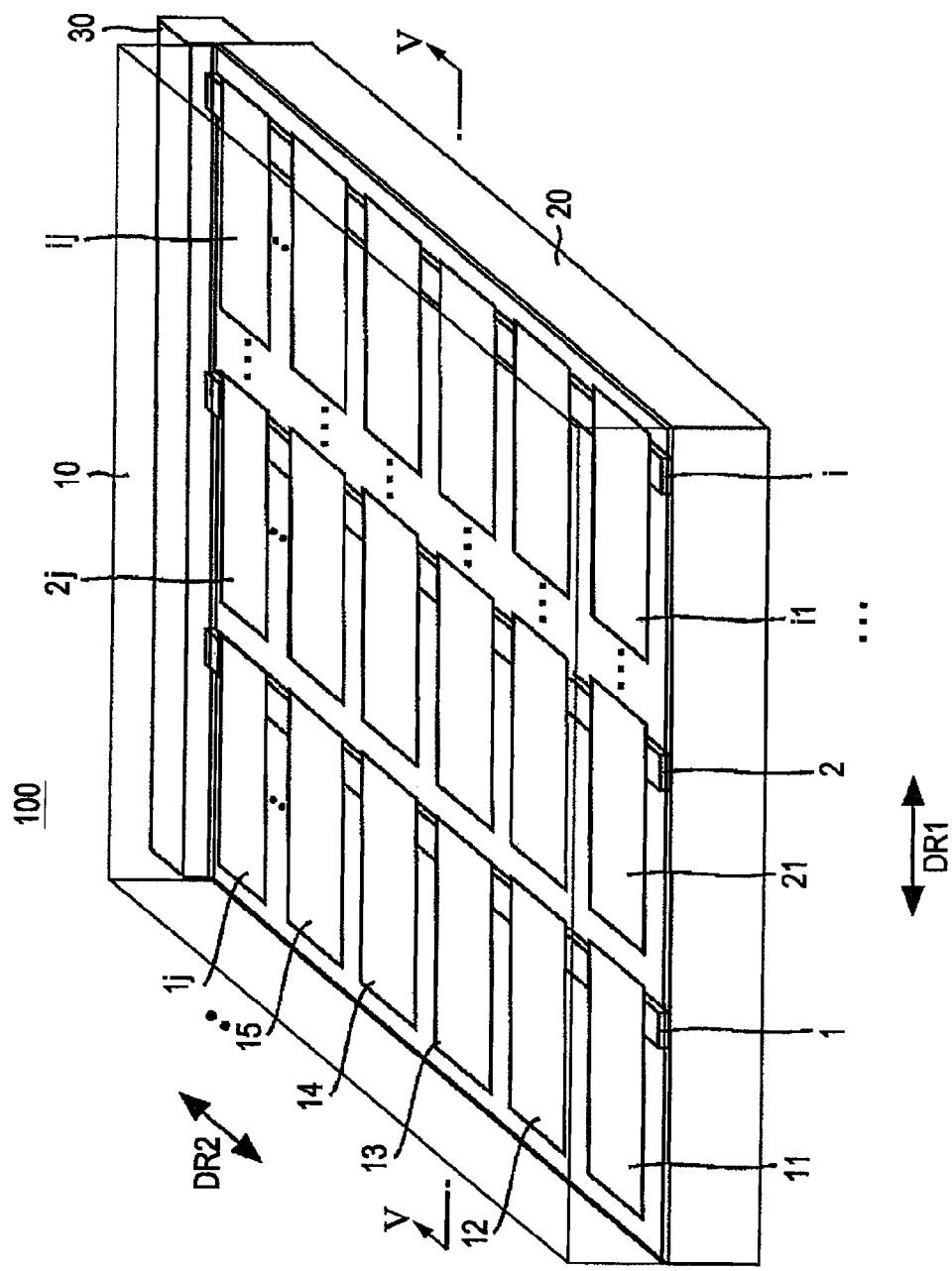
FIG. 1 is a perspective view of an optical integrated circuit apparatus according to a representative embodiment.

With reference to drawings, representative embodiments will be described in detail. Identical reference numerals refer to identical or equivalent part in the drawings, and repetitive description thereon will be omitted.

FIG. 1 is a perspective view of an optical integrated circuit apparatus according to a representative embodiment. With reference to FIG. 1, an optical integrated circuit apparatus 100 according to an embodiment includes a optical transmission member 10, a semiconductor substrate 20, a light source 30, optical waveguides 1 to i (where i is a positive integer), and optical transmission/reception units 11 to 1j, 21 to 2j ... and i1 to ij (where j is an integer equal to or higher than 2). The optical integrated circuit apparatus 100 is 1 to 2 cm square.

The optical transmission member 10 has a planer shape and contains a transparent material having a higher refractive index than the refractive index of the air such as silicon nitride (SiN), silicon dioxide ($SiO_2$), silicon oxynitride (SiON), a resist and a plastic.

The semiconductor substrate 20 may contain n-type silicon and is placed closely to one flat surface of the optical transmission member 10. The light source 30 is placed on one end surface of the semiconductor substrate 20.

Each of the optical waveguides 1 to i contains the same material as that of the optical transmission member 10 and has the same length as the length of the semiconductor substrate 20 in a direction DR2 and a width of 0.3 mm to 5 mm. The optical waveguides 1 to i are placed at predetermined intervals on one principal plane of the semiconductor substrate 20 in a direction DR1.

The optical transmission/reception units 11 to 1j, 21 to 2j ... and i1 to ij are placed two-dimensionally on the semiconductor substrate 20. More specifically, the optical transmission/reception units 11 to 1j are provided for the optical waveguide 1 and are placed at predetermined intervals in the direction DR2. The optical transmission/reception units 21 to 2j are provided for the optical waveguide 2 and are placed at predetermined intervals in the direction DR2. In the same manner, the optical transmission/reception units i1 to ij are provided for an optical waveguide i and are placed at predetermined intervals in the direction DR2.

The optical transmission member 10 transmits light beams emitted from the optical transmission/reception units 11 to 1j, 21 to 2j ... and i1 to ij. The optical waveguides 1 to i propagate the light emitted from the light source 30 in the direction DR2. Each of the optical transmission/reception units 11 to 1j, 21 to 2j ... and i1 to ij guides a part of light propagating in the optical waveguides 1 to i into the optical transmission member 10 and detects the light transmitting in the optical transmission member 10. The light source 30 generates light beams Lg1 to Lgm having discrete wavelengths $\lambda 1, \lambda 2 ... \lambda m$ (where m is a positive integer) or continuous light Lgc having a predetermined wavelength range and emits the generated light Lg1 to Lgm or Lgc into the optical waveguide 1 to i.

Figure 2:
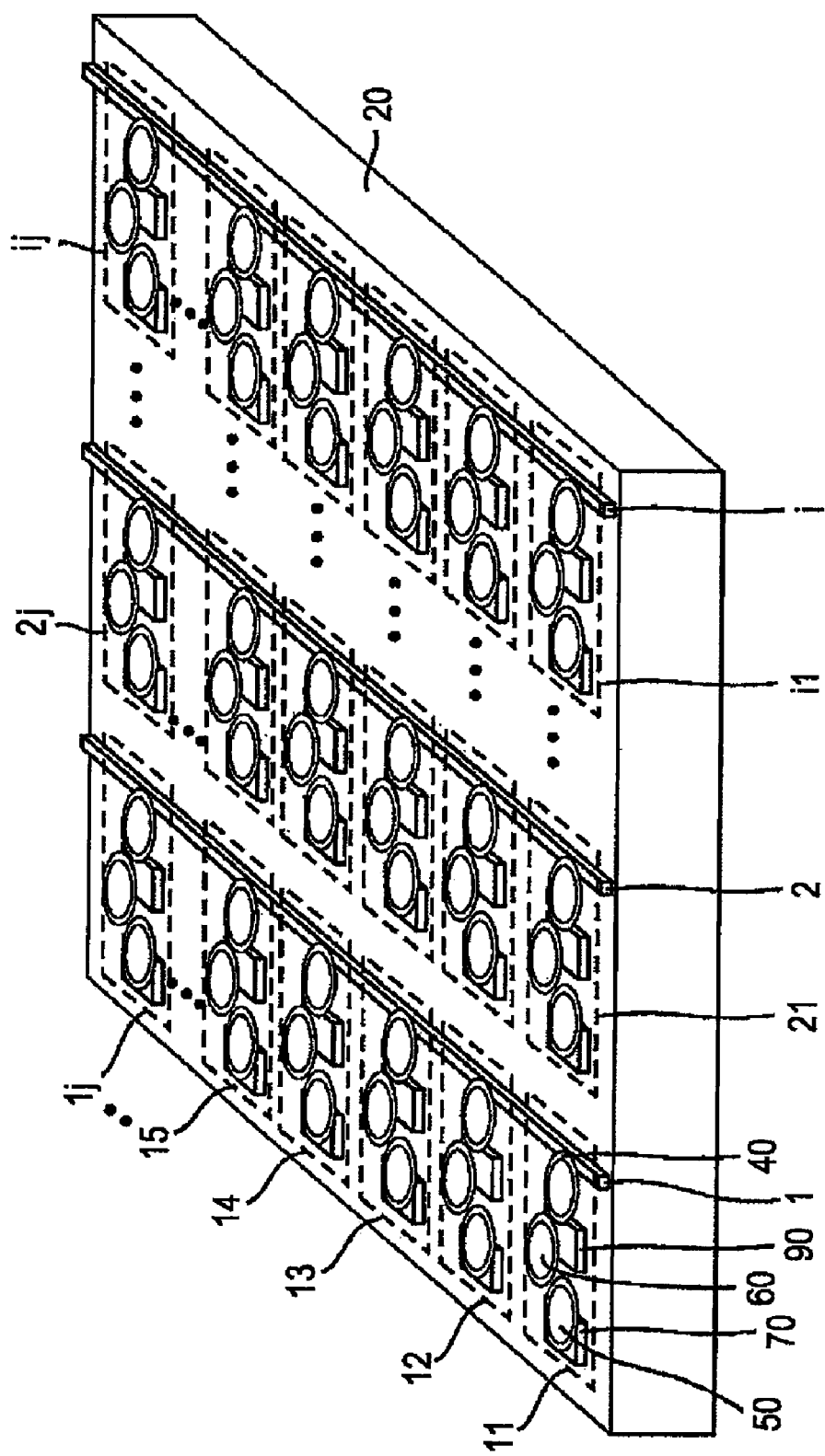
FIG. 2 is a perspective view of the semiconductor substrate, optical waveguides and optical transmission/reception units shown in FIG. 1.

FIG. 2 is a perspective view of the semiconductor substrate 20, optical waveguides 1 to i and optical transmission/reception units 11 to 1j, 21 to 2j ... and i1 to ij. Referring to FIG. 2, the optical transmission/reception unit 11 includes optical resonant members 40, 50 and 60, a photodetector unit 70 and a signal processing circuit 90.

Each of the optical resonant members 40, 50 and 60 contains an electro-optic material such as $(Ba,Sr)TiO_3$, $LiNbO_3$, $Pb(Zr,Ti)O_3$ and Si and has a ring shape. Each of the optical resonant members 40, 50 and 60 is 10 μm in diameter and 0.4 μm wide.

The optical resonant member 40 is placed on the optical waveguide 1 corresponding to the optical transmission/reception unit 11. The optical resonant members 50 and 60 are placed at remote positions from the optical resonant member 40. The photodetector unit 70 may include a photodiode and be placed below the optical resonant member 50. An another photodetector unit is placed below the optical resonant member 60, not shown in FIG. 2.

The signal processing circuit 90 is placed between the optical waveguide 1 corresponding to the optical transmission/reception unit 11 and the photodetector unit 70.

Each of the optical transmission/reception units 12 to 1j, 21 to 2j, ... and i1 to ij has the same configuration as that of the optical transmission/reception unit 11.

Figure 3:
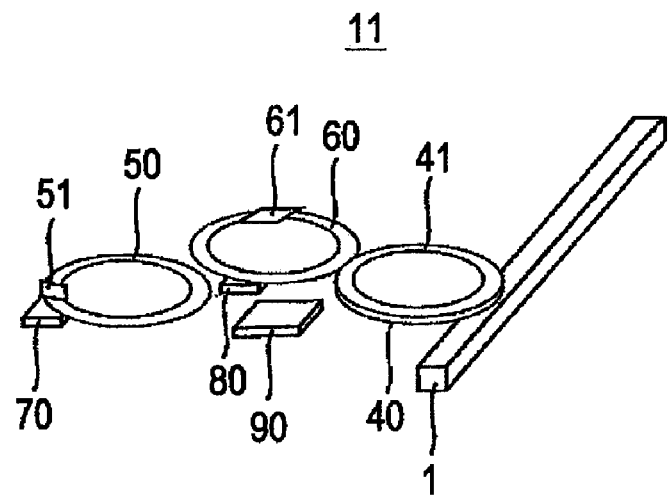
FIG. 3 is a perspective view showing the configuration of the optical transmission/reception unit shown in FIG. 2.

FIG. 3 is a perspective view showing the configuration of the optical transmission/reception unit 11 shown in FIG. 2. Referring to FIG. 3, the optical transmission/reception unit 11 further includes a photodetector unit 80 in addition to the optical resonant members 40, 50 and 60, the photodetector unit 70 and the signal processing circuit 90.

The photodetector unit 80 includes a photodiode and is placed below the optical resonant member 60. The optical resonant member 40 has a light emitting window 41. The light emitting window 41 has a ring shape and has an equal diameter and width as those of the optical resonant member 40. The light emitting window 41 is placed on the optical resonant member 40 in contact with the optical resonant member 40.

The optical resonant member 50 has a light incident window 51, and the optical resonant member 60 has a light incident window 61. The light incident windows 51 and 61 have a substantially square shape and are placed on the optical resonant members 50 and 60 in contact with the optical resonant members 50 and 60, respectively.

Each of the optical transmission/reception units 12 to 1j, 21 to 2j ... and i1 to ij has the same configuration as that of the optical transmission/reception unit 11 shown in FIG. 3.

Figure 4:
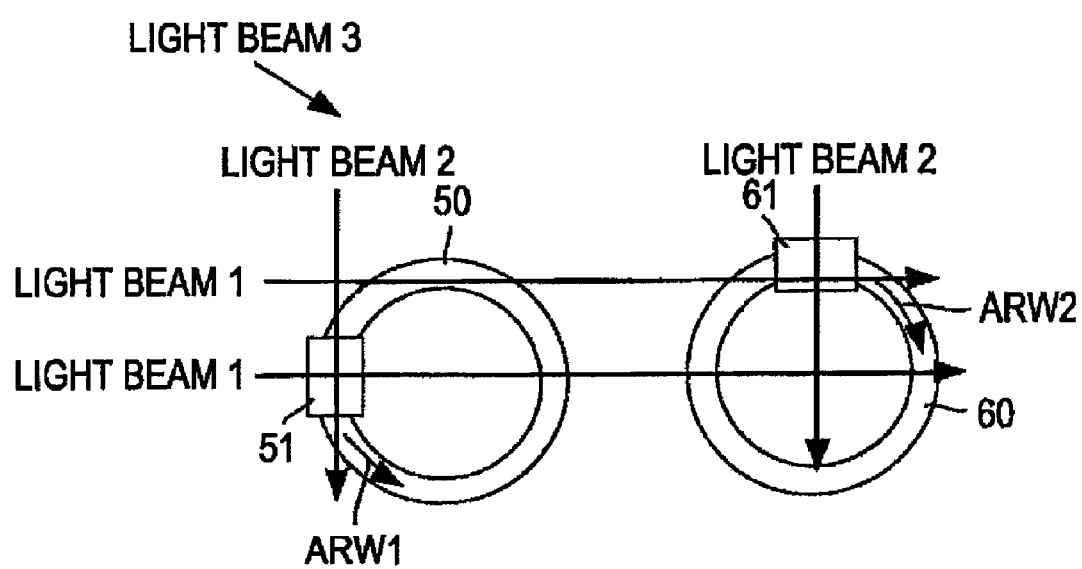
FIG. 4 is a plan view of the two optical resonant members shown in FIG. 3.

FIG. 4 is a plan view of the two optical resonant members 50 and 60 shown in FIG. 3. Referring to FIG. 4, the optical resonant members 50 and 60 are placed such that the light incident window 51 and light incident window 61 can be displaced from each other by 90 degrees.

As a result, a light beam 1 enters into the optical resonant member 60 through the light incident window 61 and propagates in the optical resonant member 60 in the direction of the arrow ARW2. A light beam 2 enters into the optical resonant member 50 through the light incident window 51 and propagates in the optical resonant member 50 in the direction of the arrow ARW1. A light beam 3 enters into the optical resonant members 50 and 60 through the light incident windows 51 and 61, respectively, and propagates in the optical resonant members 50 and 60 in the directions of the arrows ARW1 and ARW2.

In this way, the 90-degree displacement of the light incident window 51 provided on the optical resonant member 50 and the light incident window 61 provided on the optical resonant member 60 allows the light beam propagating in all directions in the optical transmission member 10 to enter to the optical resonant member 50 and/or optical resonant member 60.

Figure 5:
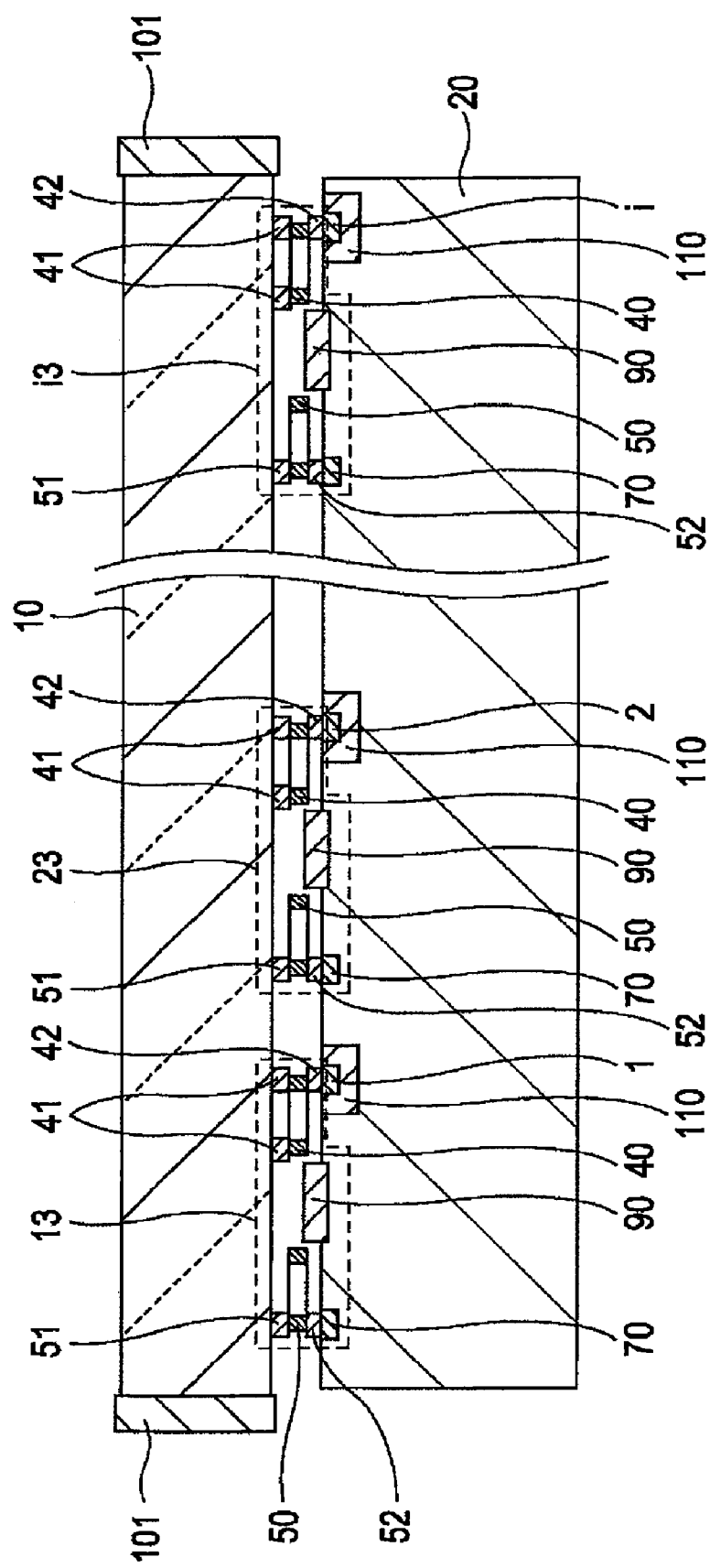
FIG. 5 is a section view of the optical integrated circuit apparatus, which is taken at the line V-V shown in FIG. 1.

FIG. 5 is a section view of the optical integrated circuit apparatus 100, which is taken at the line V-V shown in FIG. 1. Referring to FIG. 5, the optical transmission member 10 has a light absorbing member 101 at the circumference. The light absorbing member 101 absorbs light propagating in the optical transmission member 10 to the circumference. Thus, the reflection of light by the circumference of the optical transmission member 10 can be prevented. As a result, the interference of light in the optical transmission member 10 can be prevented, allowing accurate optical communication.

The optical waveguides 1 to i are provided on one principal plane of the semiconductor substrate 20. In this case, each of the optical waveguides 1 to i is surrounded by a silicon oxide film 110 and is embedded in the semiconductor substrate 20 such that one surface can be substantially matched with one principal plane of the semiconductor substrate 20 and is formed on the one principal surface of the semiconductor substrate 20. The thickness of the silicon oxide film 110 is 1.5 µm.

In this way, the silicon oxide film 110 surrounding the optical waveguides 1 to i allows the propagation of light in the optical waveguides 1 to i by reducing the optical loss.

Each of the optical transmission/reception units 11 to 1j, 21 to 2j . . . and i1 to ij further includes optical coupling windows 42 and 52.

The optical coupling window 42 included in each of the optical transmission/reception units 11 to 1j, 21 to 2j . . . and i1 to ij is provided in contact with the optical waveguides 1 to i on the optical waveguides 1 to i corresponding to the optical transmission/reception units 11 to 1j, 21 to 2j . . . and i1 to ij.

The optical resonant member 40 included in each of the optical transmission/reception units 11 to 1j, 21 to 2j . . . and i1 to ij is provided between the light emitting window 41 and the optical coupling window 42 in contact with the light emitting window 41 and the optical coupling window 42 included in each of the optical transmission/reception units 11 to 1j, 21 to 2j . . . and i1 to ij.

The light emitting window 41 included in each of the optical transmission/reception units 11 to 1j, 21 to 2j . . . and i1 to ij is provided between the optical transmission member 10 and the optical resonant member 40 in contact with the optical transmission member 10 and the optical resonant member 40. Then, the light emitting window 41 contains a material having a refractive index, which is lower than the refractive indices of the optical transmission member 10 and the optical resonant members 40, 50 and 60 and is higher than that of the refractive index of the circumference.

The light incident window 51 included in each of the optical transmission/reception units 11 to 1j, 21 to 2j . . . and i1 to ij is provided between the optical transmission member 10 and optical resonant member 50 in contact with the optical transmission member 10 and the optical resonant member 50. Then, the light incident window 51 contains a material having a refractive index, which is lower than the refractive indices of the optical transmission member 10 and the optical resonant members 40, 50 and 60 and is higher than that of the refractive index of the circumference.

The optical resonant member 50 included in each of the optical transmission/reception units 11 to 1j, 21 to 2j . . . and i1 to ij is provided between the light incident window 51 and the optical coupling window 52 included in each of the optical transmission/reception units 11 to 1j, 21 to 2j . . . and i1 to ij in contact with the light incident window 51 and the optical coupling window 52.

The optical coupling window 52 included in each of the optical transmission/reception units 11 to 1j, 21 to 2j . . . and i1 to ij is provided between the optical resonant member 50 and the photodetector unit 70 included in each of the optical transmission/reception units 11 to 1j, 21 to 2j . . . and i1 to ij in contact with the optical resonant member 50 and photodetector unit 70.

Each of the optical transmission/reception units 11 to 1j, 21 to 2j . . . and i1 to ij further includes an optical coupling window 62, and the optical resonant member 60, light incident window 61, optical coupling window 62 and photodetector unit 80 are placed like the optical resonant member 50, the light incident window 51, the optical coupling window 52 and the photodetector unit 70 shown in FIG. 5.

The photodetector unit 70 included in each of the optical transmission/reception units 11 to 1j, 21 to 2j . . . and i1 to ij is embedded in the semiconductor substrate 20 and is provided on one principal plane of the semiconductor substrate 20 like the optical waveguides 1 to i.

The signal processing circuit 90 included in each of the optical transmission/reception units 11 to 1j, 21 to 2j . . . and i1 to ij is provided on one principal plane of the semiconductor substrate 20 between the optical waveguides 1 to i corresponding to the optical transmission/reception units 11 to 1j, 21 to 2j . . . and i1 to ij and the photodetector unit 70.

The semiconductor substrate 20 is placed closely to the optical transmission member 10 such that the space between the light emitting window 41 and light incident windows 51 and 61 included in each of the optical transmission/reception units 11 to 1j, 21 to 2j . . . and i1 to ij and the optical transmission member 10 can be 0.2 µm.

$$2\pi r = s\lambda_0/n \quad [\text{EQ1}]$$

is satisfied where the diameter of the optical resonant members 40, 50 and 60 is r, the refractive index of the optical resonant members 40, 50 and 60 is n, the resonance wavelength is $\lambda_0$ and s is a positive integer.

Because the application of voltage to the optical resonant members 40, 50 and 60 changes the refractive index of the optical resonant members 40, 50 and 60, the application of voltage to the optical resonant members 40, 50 and 60 such that they can have the refractive index satisfying [EQ1] allows the propagation of light having the wavelength $\lambda_0$ into the optical resonant members 40, 50 and 60 as resonant light and the emission of a part of the resonant light into the optical transmission member 10 or to the photodetector units 70 and 80.

More specifically, the application of voltage to the optical resonant member 40 such that it can have the refractive index satisfying [EQ1] allows the propagation of light having the wavelength $\lambda_0$ into the optical resonant member 40 as resonant light through the optical coupling window 42 and the emission of a part of the resonant light into the optical transmission member 10 through the light emitting window 41. The application of voltage to the optical resonant members 50 and 60 such that they can have the refractive index satisfying [EQ1] allows the propagation of light having the wavelength $\lambda_0$ into the optical resonant members 50 and 60 through the light incident windows 51 and 61 and the emission of a part of the light to the photodetector units 70 and 80 through the optical coupling windows 52 and 62.

The optical waveguides 1 to i allow the propagation of the light beams Lg1 to Lgm having discrete wavelengths $\lambda 1$ to $\lambda m$ or the propagation of the light in a continuous wavelength range of $\lambda 1$ to $\lambda m$. Therefore, the voltage Vk to be applied to the optical resonant members 40, 50 and 60 is determined such that one wavelength $\lambda k$ (k=1 to m) of the wavelengths $\lambda 1$ to $\lambda m$ can be the resonant wavelength $\lambda_0$.

Figure 6:
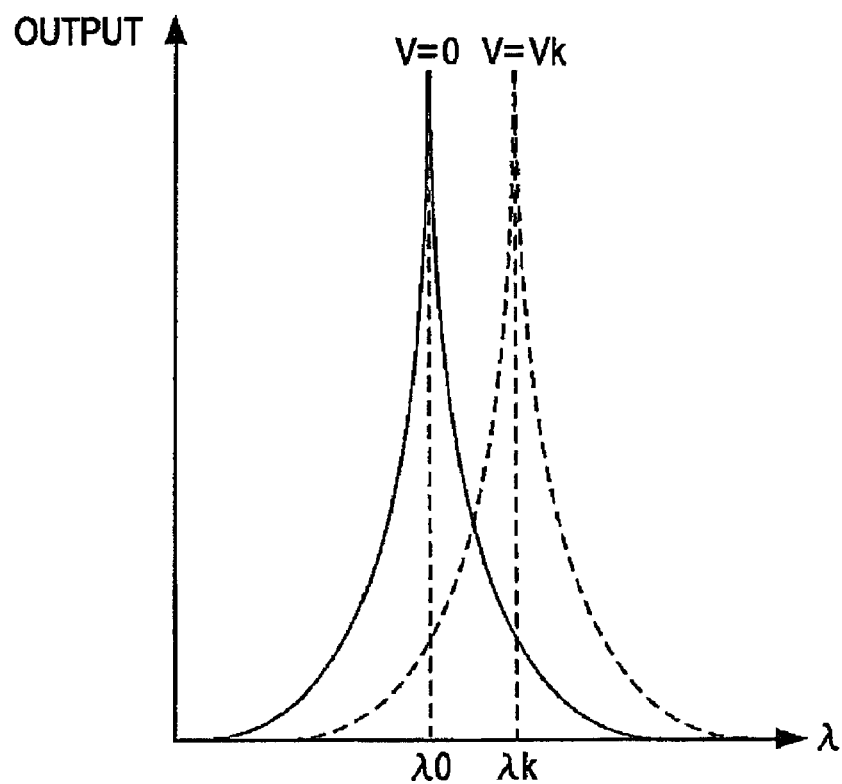
FIG. 6 is a diagram showing the relationships between the outputs of the optical resonant members and wavelengths.
Figure 7:
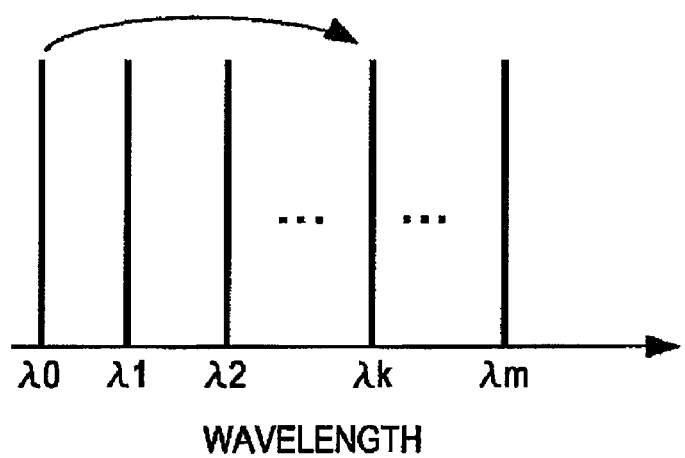
FIG. 7 is a conceptual diagram for selecting a resonant wavelength.

FIG. 6 is a diagram showing the relationships between the outputs of the optical resonant members 40, 50 and 60 and wavelengths. FIG. 7 is a conceptual diagram for selecting a resonant wavelength. Referring to FIG. 6, the optical resonant members 40, 50 and 60 output light having a peak wavelength $\lambda 0$ if no voltage is applied thereto (V=0). On the other hand, in response to the application of a voltage Vk, the optical resonant members 40, 50 and 60 resonate with the light of a wavelength $\lambda k$ and output light having the peak wavelength $\lambda k$.

Therefore, the optical resonant member 40 without the application of voltage does not resonate with the light beams Lg1 to Lgm having discrete wavelengths of λ1 to λm or the light in a continuous wavelength range of λ1 to λm propagating in the optical waveguides 1 to i. As a result, the optical resonant member 40 does not emit light into the optical transmission member 10.

On the other hand, in response to the application of the voltage Vk, the optical resonant member 40 resonates with the light beam Lgk having the wavelength λk of the light beams Lg1 to Lgm having discrete wavelengths of λ1 to λm or the light in a continuous wavelength range of λ1 to λm propagating in the optical waveguides 1 to i and emits the light beam Lgk into the optical transmission member 10.

Without the application of voltage, the optical resonant members 50 and 60 do not resonate with the light beam Lgk being transmitted in the optical transmission member 10. As a result, the optical resonant members 50 and 60 do not emit light to the photodetector units 70 and 80, respectively.

On the other hand, in response to the application of the voltage Vk, the optical resonant members 50 and 60 resonate with the light Lgk being transmitted in the optical transmission member 10 and emit the light Lgk to the photodetector units 70 and 80, respectively.

In this way, the optical resonant member 40 in response to the application of the voltage Vk emits partial light Lgk of the light beams Lg1 to Lgm or the light beam having a wavelength λk in a continuous wavelength range of λ1 to λm propagating in the optical waveguides 1 to i while the optical resonant member 40 without the application of voltage does not emit light into the optical transmission member 10.

The optical resonant members 50 and 60 in response to the application of the voltage Vk emit the light Lgk propagating in the optical transmission member 10 to the photodetector units 70 and 80, respectively, while the optical resonant members 50 and 60 without the application of voltage does not emit light to the photodetector units 70 and 80.

The photodetector unit 70 detects the intensity of light emitted from the optical resonant member 50 and outputs the detected intensity to the signal processing circuit 90.

The photodetector unit 80 detects the intensity of light emitted from the optical resonant member 60 and outputs the detected intensity to the signal processing circuit 90.

In order to transmit a signal to other optical transmission/reception unit, the signal processing circuit 90 repetitively performs the application of the voltage Vk to the optical resonant member 40 and the non-application of the voltage Vk to the optical resonant member 40. More specifically, the signal processing circuit 90 applies the voltage Vk to the optical resonant member 40 in accordance with a digital signal "1" and stops the application of the voltage Vk to the optical resonant member 40 in accordance with a digital signal "0."

In order to receive a signal from other optical transmission/reception unit, the signal processing circuit 90 applies the voltage Vk to the optical resonant members 50 and 60.

The signal processing circuit 90 further demodulates and processes the signal on the basis of the intensities of light received from the photodetector units 70 and 80. More specifically, the signal processing circuit 90 calculates the sum of the two intensities of light received form the photodetector units 70 and 80 and demodulates and processes the signal on the basis of the calculated sum.

Figure 8:
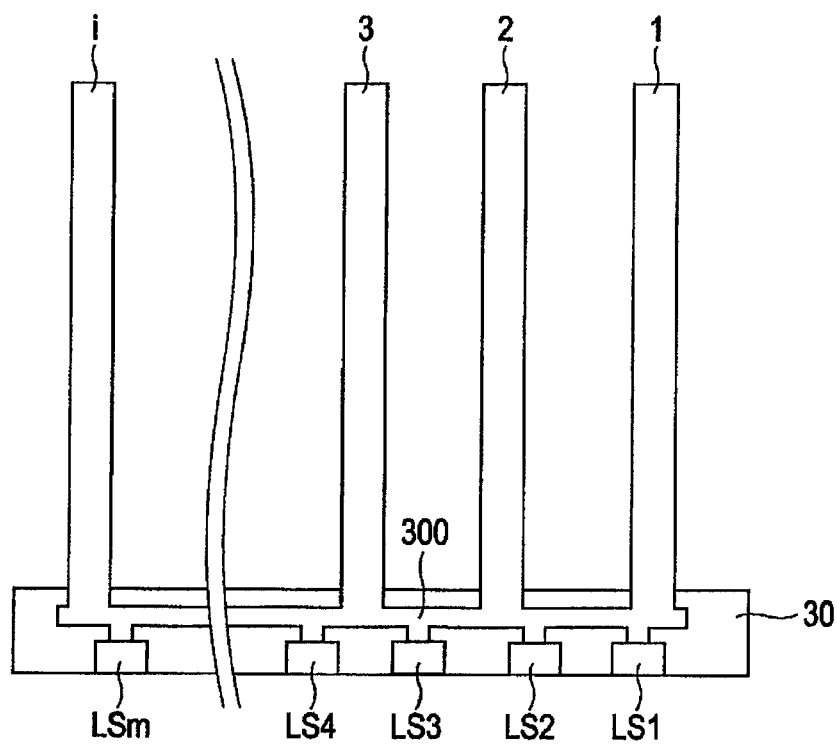
FIG. 8 is a configuration diagram of the light source shown in FIG. 1.

FIG. 8 is a configuration diagram of the light source 30 shown in FIG. 1. Referring to FIG. 8, the light source 30 includes lasers LS1 to LSm and a waveguide 300. The waveguide 300 connects to the lasers LS1 to LSm and the optical waveguides 1 to i.

The lasers LS1 to LSm oscillate the light beams Lg1 to Lgm having wavelengths λ1 to λm, respectively, and emit the oscillated light beams Lg1 to Lgm to the waveguide 300. The waveguide 300 propagates the light beams Lg1 to Lgm received from the lasers LS1 to LSm and guides them to the optical waveguides 1 to i.

In this way, the light source 30 generates the light beams Lg1 to Lgm having the wavelengths λ1 to λm and guides the generated light beams Lg1 to Lgm to the optical waveguides 1 to i.

Figure 9:
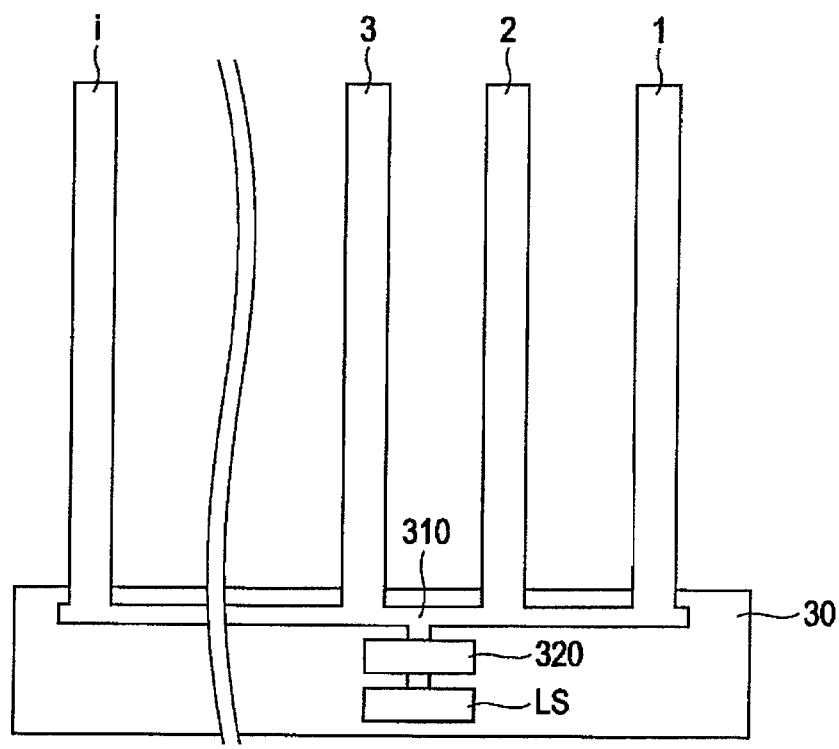
FIG. 9 is another configuration diagram of the light source shown in FIG. 1.

FIG. 9 is another configuration diagram of the light source 30 shown in FIG. 1. Referring to FIG. 9, the light source 30 includes a light emitting device LS, a waveguide 310 and a filter 320. The waveguide 310 connects to the optical waveguides 1 to i and the filter 320. The filter 320 connects to the light emitting device LS and the waveguide 310.

The light emitting device LS may include an ultraviolet ray excited phosphor and light emitting device and emits light with continuous wavelengths. The filter 320 only allows light with a predetermined wavelength range of the light with continuous wavelengths, which is emitted from the light emitting device LS, to pass through to the waveguide 310. The waveguide 310 guides the light with continuous wavelengths received from the filter 320 to the optical waveguides 1 to i.

In representative embodiments, the light source 30 may have any of the configuration shown in FIG. 8 and the configuration shown in FIG. 9.

FIGS. 10 to 14 are first to fifth step diagrams explaining a method for producing the optical integrated circuit apparatus 100 shown in FIG. 1, respectively. Starting the producing of the optical integrated circuit apparatus 100, a resist is coated on one principal plane of the semiconductor substrate 20 made of n-type Si, and the coated resist is patterned by photolithography to form a resist pattern 120 on the principal plane of the semiconductor substrate 20 (refer to step (a) in FIG. 10).

Figure 10:
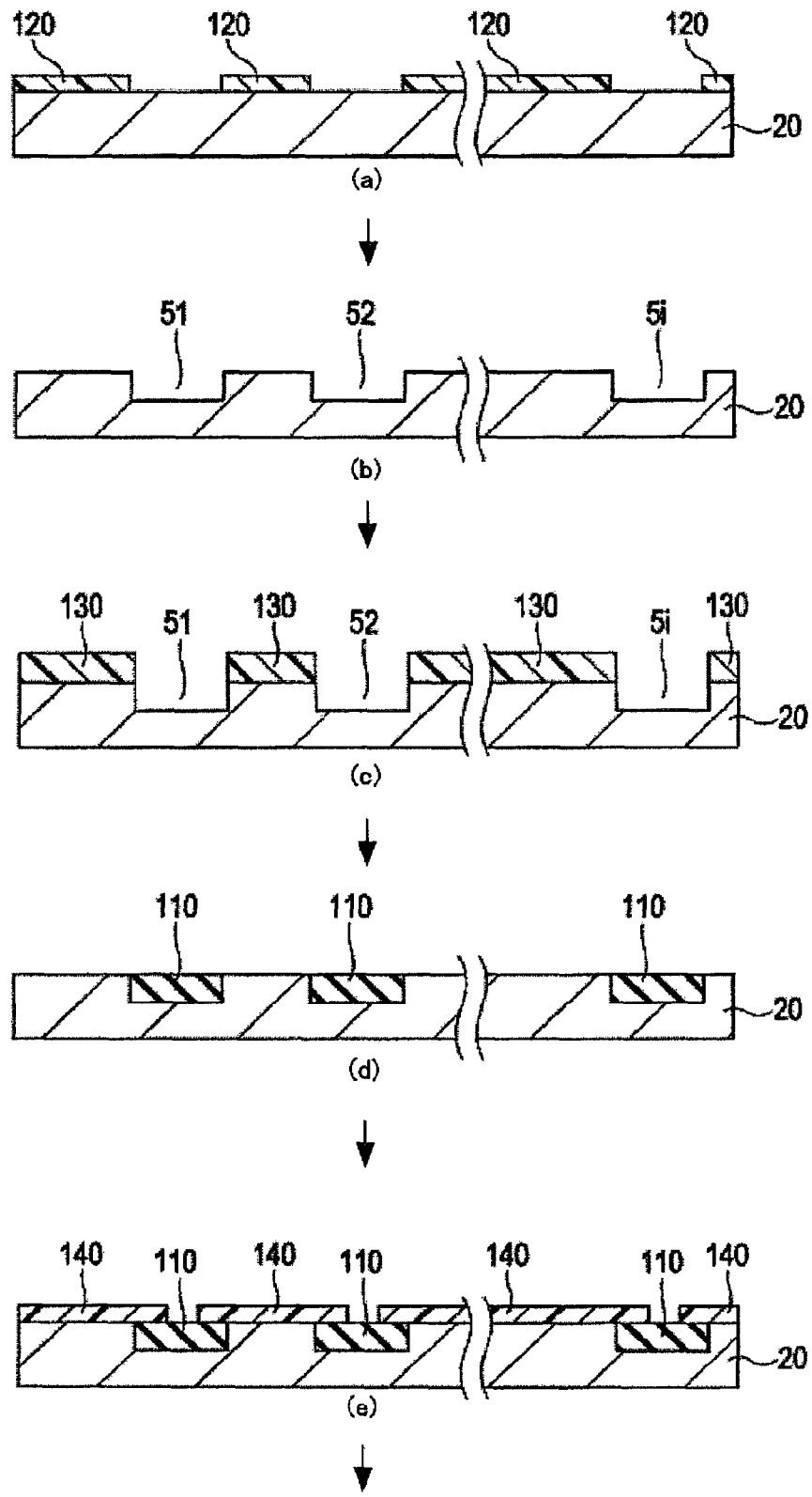
FIG. 10 is a first step diagram group for explaining a method for producing the optical integrated circuit apparatus shown in FIG. 1.
Figure 11:
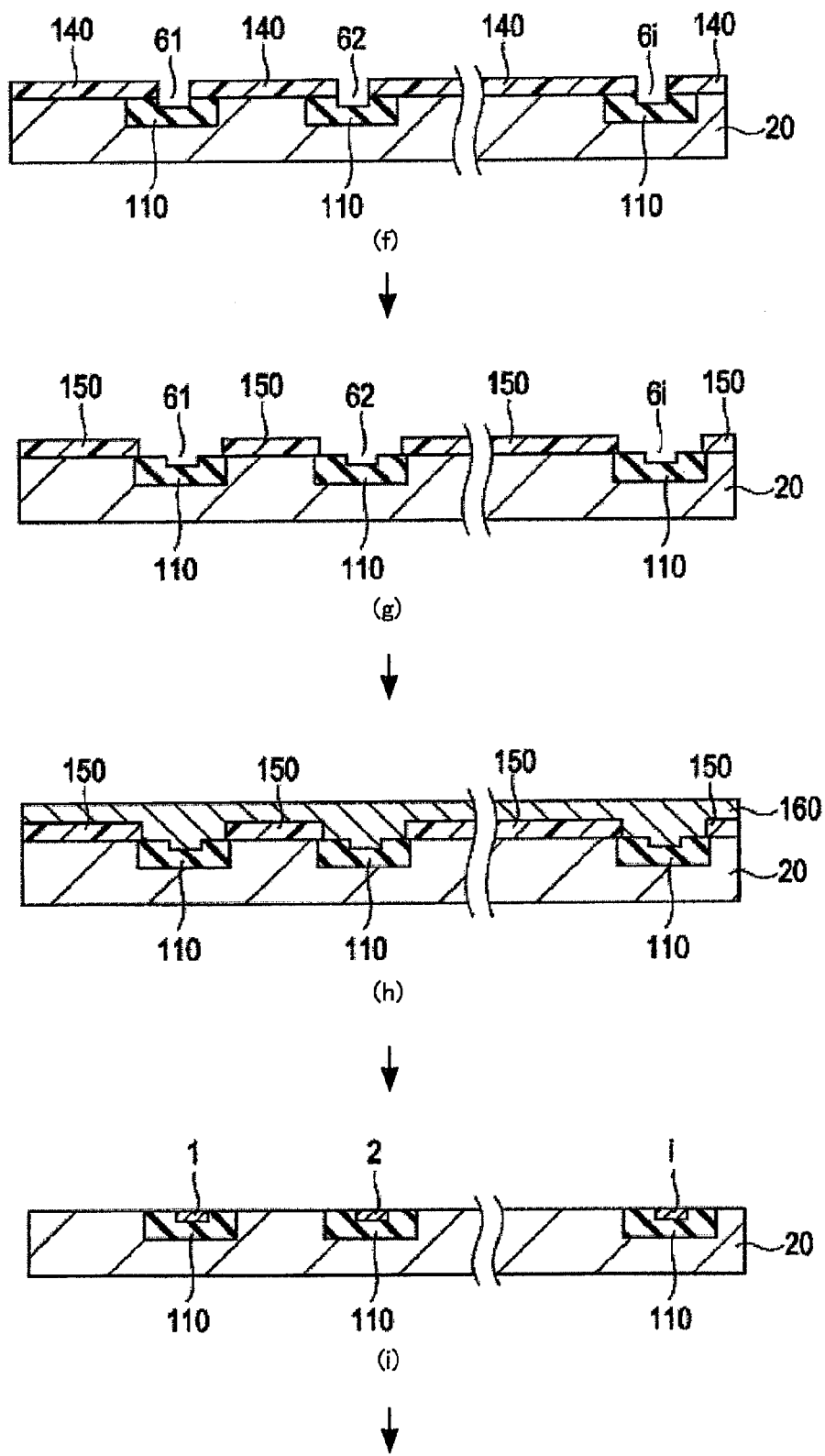
FIG. 11 is a second step diagram explaining the method for producing the optical integrated circuit apparatus shown in FIG. 1.

Then, by using the resist pattern 120 as a mask, the principal plane of the semiconductor substrate 20 is etched by reactive ion etching to form grooves 51 to 5i on the principal plane of the semiconductor substrate 20 (refer to step (b) in FIG. 10). In this case, the grooves 51 to 5i are approximately 1.5 μm deep.

After that, a resist is coated so as to cover the entire surface of the semiconductor substrate 20, and the coated resist is patterned by photolithography to form a resist pattern 130 in an area excluding the groove 51 to 5i (refer to step (c) in FIG. 10).

Then, a silicon oxide film is formed by plasma CVD (Chemical Vapor Deposition) on the principal plane of the semiconductor substrate 20 so as to cover the grooves 51 to 5i and resist pattern 130, and the resist pattern 130 is removed. Thus, a silicon oxide film 110 is formed on the principal plane of the semiconductor substrate 20 (refer to step (d) in FIG. 10). In this case, silane (SiH$_4$) gas and N$_2$O gas are used as source gases of the silicon oxide film 110.

Then, a resist is coated so as to cover the entire surface of the semiconductor substrate 20, and the coated resist is patterned by photolithography to form a resist pattern 140 such that a part of the silicon oxide film 110 can open (refer to step (e) in FIG. 10).

Then, by using the resist pattern 140 as a mask, the silicon oxide film 110 is etched by reactive ion etching to form grooves 61 to 6i on the silicon oxide film 110 (refer to step (f) in FIG. 10). Then, the resist pattern 140 is removed.

After that, a resist is coated so as to cover the surface of the grooves 61 to 6i and the semiconductor substrate 20, and the coated resist is patterned by photolithography to form a resist pattern 150 such that the area of the silicon oxide film 110 can open (refer to step (g) in FIG. 10).

Then, a silicon nitride (SiN) film 160 is formed by sputtering on the principal plane of the semiconductor substrate 20 so as to cover the grooves 61 to 6i and resist pattern 150 (refer to step (h) in FIG. 10).

After that, the SiN film 160 is etched until the surface of the silicon oxide film 110 is exposed, and the resist pattern 150 is removed.

Thus, the optical waveguides 1 to i surrounded by the silicon oxide film 110 are formed on the principal plane of the semiconductor substrate 20 (refer to step (i) in FIG. 10).

Subsequently, a resist is coated over the entire surface of the semiconductor substrate 20 so as to cover the optical waveguides 1 to i, and the coated resist is patterned by photolithography to form a resist pattern 170 on an area excluding the silicon oxide film 110. Then, by using the resist pattern 170 as a mask, boron ion ($B^+$) is implanted to a part of the area by ion plantation to form p-n junction. Thus, the photodetector units 70 and 80 included in each of the optical transmission/reception units 11 to 1j, 21 to 2j . . . and i1 to ij are formed on the principal plane of the semiconductor substrate 20 (refer to step (j) in FIG. 10). While the photodetector unit 70 is only shown in FIG. 12, the photodetector unit 80 is formed in the area on the back side on the paper in reality.

Figure 12:
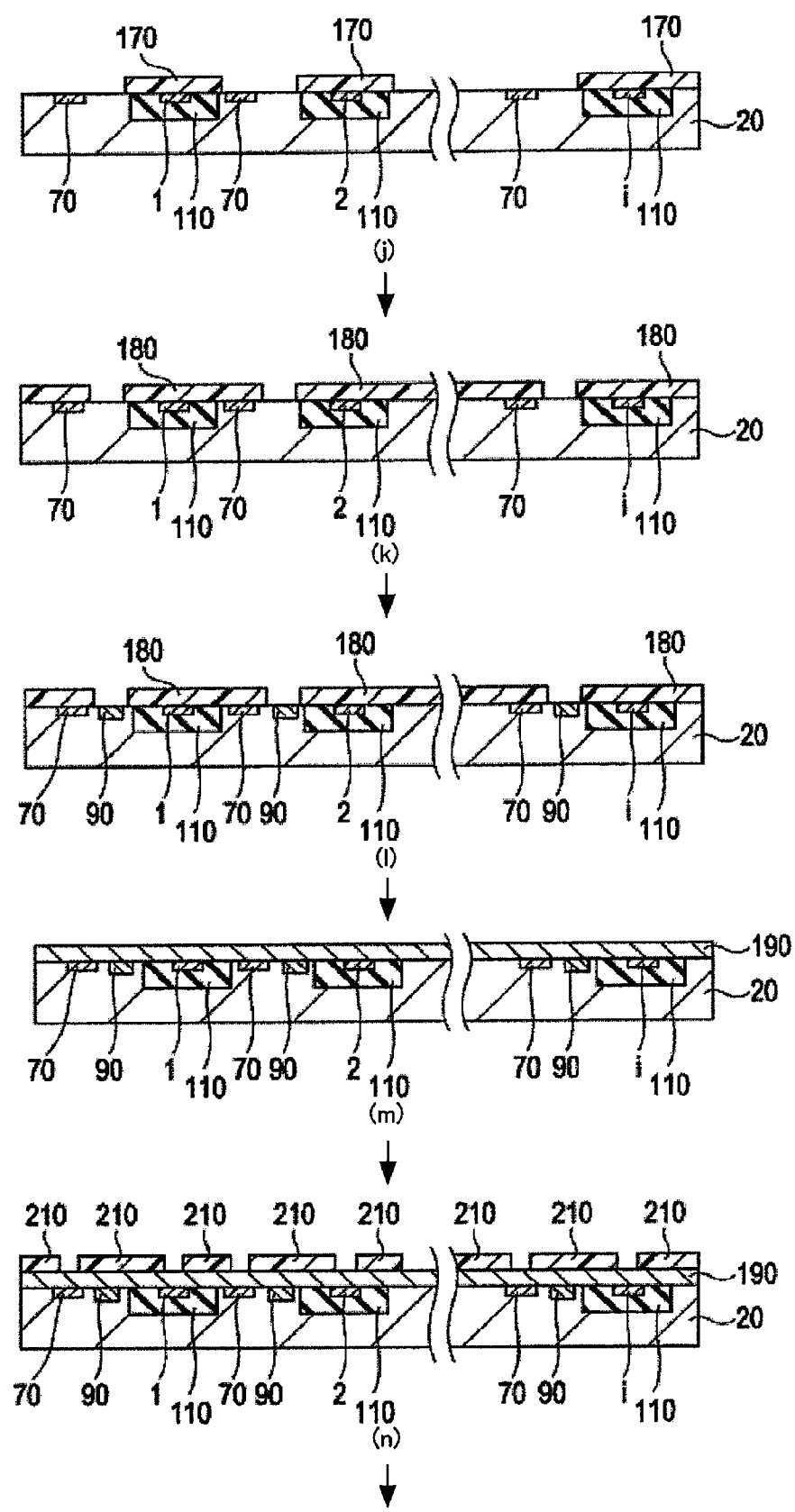
FIG. 12 is a third step diagram explaining the method for producing the optical integrated circuit apparatus shown in FIG. 1.

After that, a resist is coated over the entire surface of the semiconductor substrate 20, and the coated resist is patterned by photolithography to form a resist pattern 180 (refer to step (k) in FIG. 12).

Then, by using the resist pattern 180 as a mask, the signal processing circuit 90 included in each of the optical transmission/reception units 11 to 1j, 21 to 2j . . . and i1 to ij is formed between the optical waveguides 1 to i and the photodetector unit 70 (refer to step (1) in FIG. 12).

After that, an SiN film 190 is formed by sputtering on the entire surface of the semiconductor substrate 20 so as to cover the photodetector units 70 and 80, the signal processing circuit 90 and the optical waveguides 1 to i (refer to step (m) in FIG. 12). Then, a resist is coated over the entire surface of the SiN film 190, and the coated resist is patterned by photolithography to form a resist pattern 210 (refer to step (n) in FIG. 12).

Then, by using the resist pattern 210 as a mask, the SiN film 190 is etched. Thus, the optical coupling windows 42 and 52 included in the optical transmission/reception units 11 to 1j, 21 to 2j . . . and i1 to ij are formed on the optical waveguides 1 to i and photodetector unit 70, respectively (refer to step (o) in FIG. 13). The optical coupling window 62, not shown in FIG. 13, is also formed on the photodetector unit 80 at the same time as the formation of the optical coupling windows 42 and 52.

Figure 13:
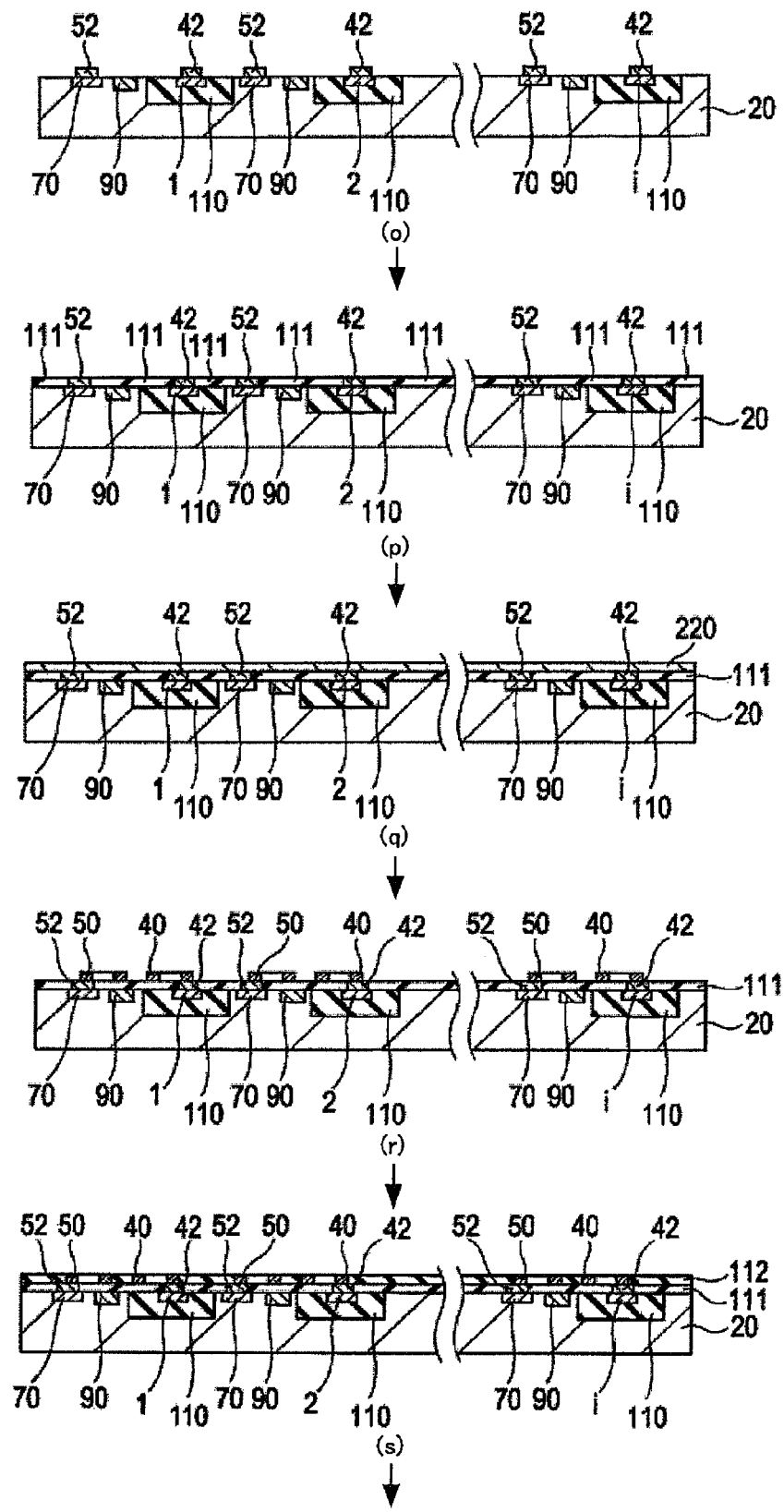
FIG. 13 is a fourth step diagram explaining the method for producing the optical integrated circuit apparatus shown in FIG. 1.

After that, a silicon oxide film is formed by plasma CVD on the entire surface of the semiconductor substrate 20, and the formed silicon oxide film is etched until the optical coupling windows 42, 52 and 62 are exposed to form a silicon oxide film 111 having an equal thickness as those of the optical coupling windows 42, 52 and 62 on the area excluding the optical coupling windows 42, 52 and 62 (refer to step (p) in FIG. 13).

Then, a (Ba,Sr)TiO$_3$ film 220 is formed by sputtering over the entire surface of the semiconductor substrate 20 so as to cover the silicon oxide film 111 and optical coupling windows 42, 52 and 62 (refer to step (q) in FIG. 13).

Then, a resist is coated over the entire surface of the (Ba, Sr)TiO$_3$ film 220, and the coated resist is patterned by photolithography. Then, by using the patterned resist as a mask, the (Ba,Sr)TiO$_3$ film 220 is etched. Thus, the optical resonant members 40 and 50 included in each of the optical transmission/reception units 11 to 1j, 21 to 2j . . . and i1 to ij are formed on the optical coupling windows 42 and 52, respectively (refer to step (r) in FIG. 13). The optical resonant member 60, not shown in FIG. 13, is also formed on the optical coupling window 62 at the same time as the formation of the optical resonant members 40 and 50.

After that, a silicon oxide film is formed by plasma CVD over the entire surface of the semiconductor substrate 20, and the formed silicon oxide film is etched until the optical resonant members 40, 50 and 60 are exposed to form a silicon oxide film 112 having an equal thickness as those of the optical resonant members 40, 50 and 60 on the area excluding the optical resonant members 40, 50 and 60 (refer to step (s) in FIG. 13).

Subsequently, an SiN film 230 is formed by sputtering on the optical resonant members 40, 50 and 60 and silicon oxide film 112 (refer to step (t) in FIG. 14). Then, a resist is coated over the entire surface of the SiN film 230, and the coated resist is patterned by photolithography. The patterned resist is used as a mask to etch the SiN film 230. Thus, the light emitting window 41 and light incident window 51 included in the optical transmission/reception units 11 to 1j, 21 to 2j . . . and i1 to ij are formed on the optical resonant members 40 and 50, respectively (refer to step (u) in FIG. 14). The light incident window 61, not shown in FIG. 14, is also formed on the optical resonant member 60 at the same time as the formation of the light emitting window 41 and light incident window 51.

Figure 14:
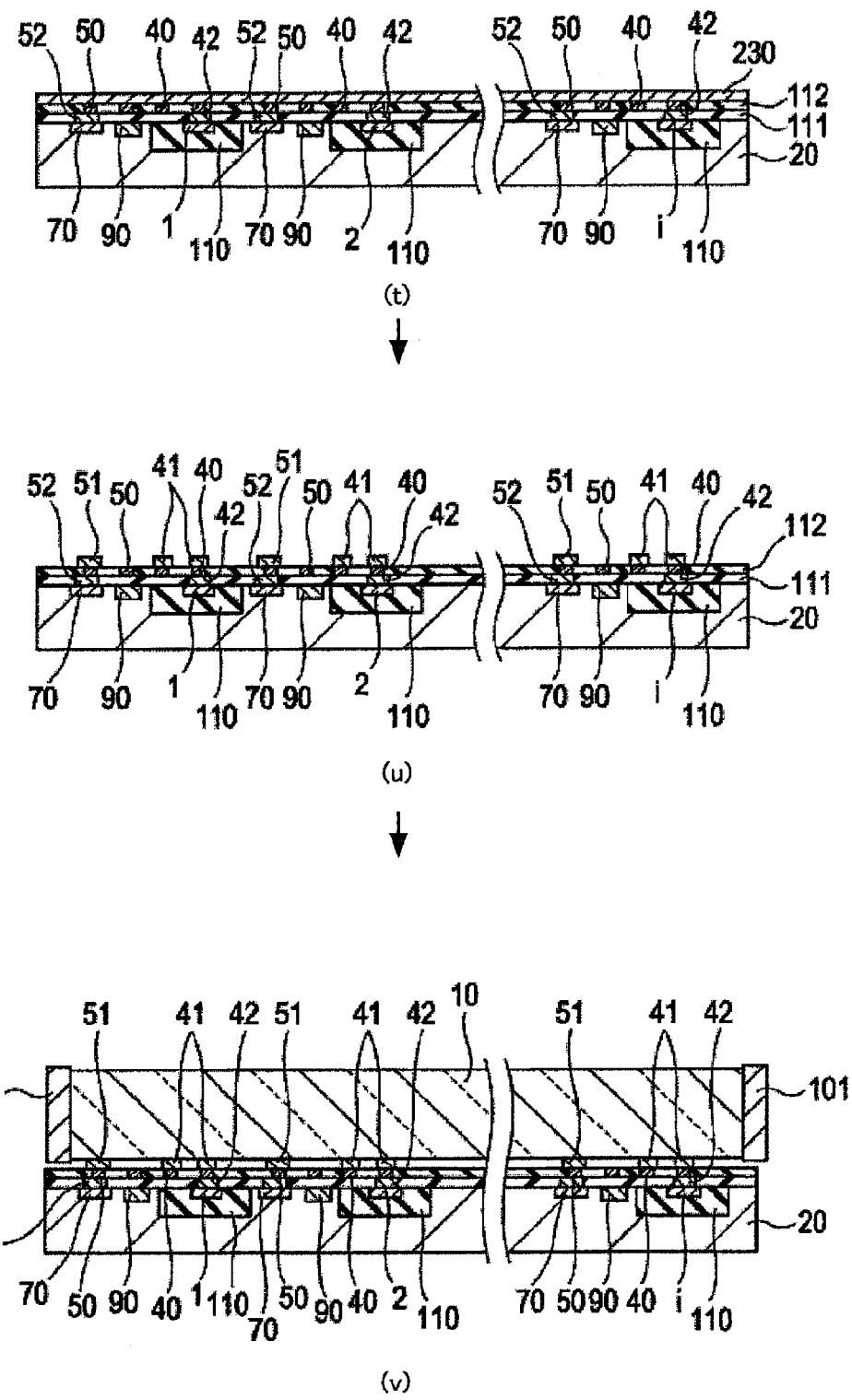
FIG. 14 is a fifth step diagram explaining the method for producing the optical integrated circuit apparatus shown in FIG. 1.

Then, the optical transmission member 10 surrounded by the light absorbing member 101 and the semiconductor substrate 20 are pasted together (refer to step (v) in FIG. 14). Thus, the optical integrated circuit apparatus 100 is completed.

As described above, the optical integrated circuit apparatus 100 can be produced easily by using the semiconductor process.

Figure 15:
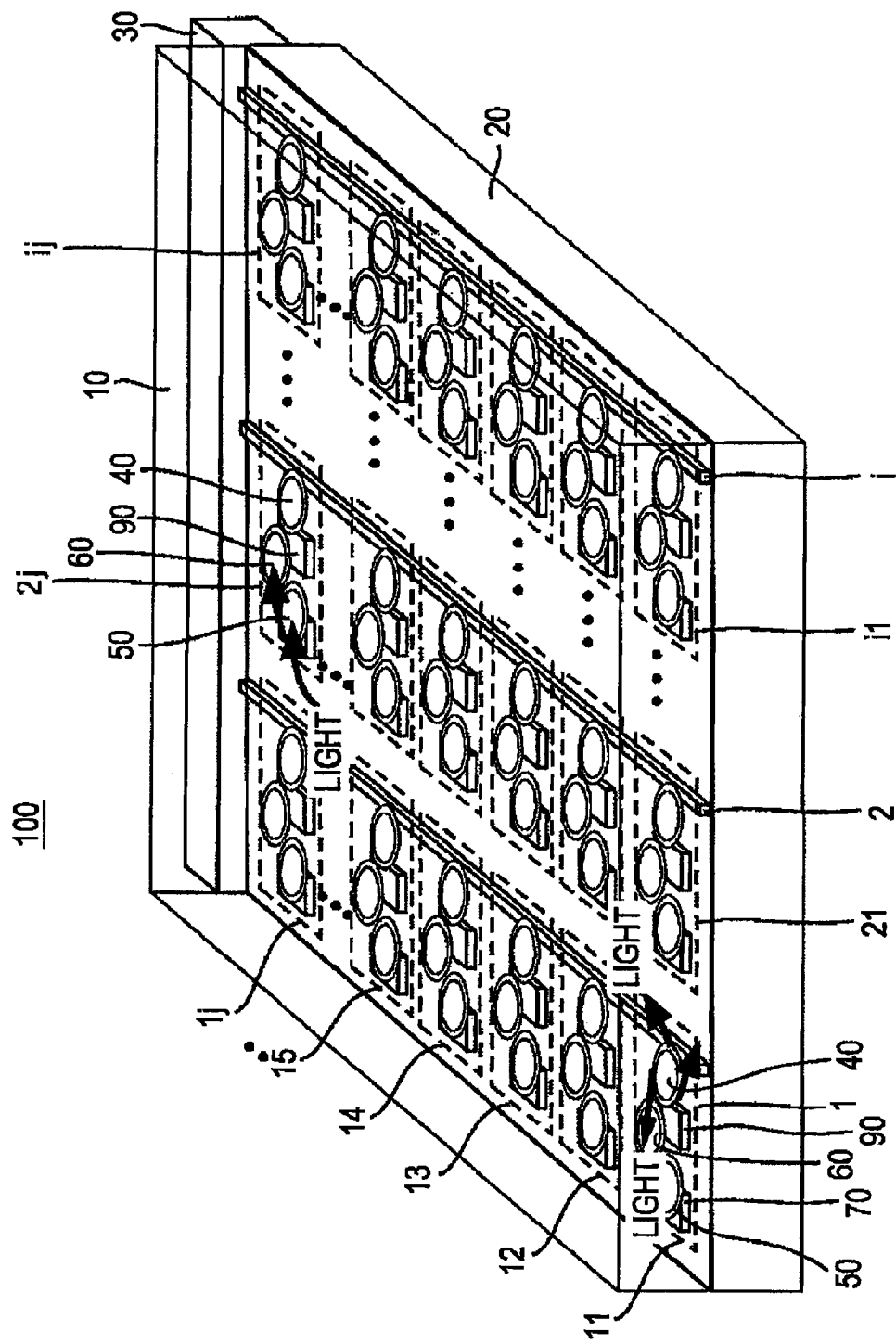
FIG. 15 is a diagram for explaining the exchange of signals in the optical integrated circuit apparatus shown in FIG. 1.

FIG. 15 is a diagram for explaining the exchange of signals in the optical integrated circuit apparatus 100 shown in FIG. 1. In the exchange of signals in the optical integrated circuit apparatus 100, the signal processing circuit 90 in the optical transmission/reception unit that transmits a signal applies the voltage Vk to the optical resonant members 50 and 60 for a certain period of time and transmits a signal if the photodetector units 70 and 80 do not detect light propagating in the optical transmission member 10. The optical transmission/reception units excluding the optical transmission/reception unit that transmits a signal apply the voltage Vk to the optical resonant members 50 and 60 periodically and receive light transmitted from other optical transmission/reception units.

Referring to FIG. 15, the lasers LS1 to LSm of the light source 30 oscillate the light beams Lg1 to Lgm having the wavelengths $\lambda 1$ to $\lambda m$ and emit the oscillated light beams Lg1 to Lgm to the waveguide 300. The waveguide 300 propagates the light beams Lg1 to Lgm from the lasers LS1 to LSm and guides them to the optical waveguides 1 to i. Then, the optical waveguides 1 to i propagate the light beams Lg1 to Lgm.

When the optical transmission/reception unit 11 transmits a signal, the signal processing circuit 90 in the optical transmission/reception unit 11 applies the voltage Vk to the optical resonant member 40 in accordance with the "1" in the transmit signal or does not apply voltage to the optical resonant member 40 in accordance with the "0" in the transmit signal.

If the voltage Vk is applied from the signal processing circuit 90, the optical resonant member 40 in the optical transmission/reception unit 11 resonates with the light beam Lgk having a wavelength $\lambda k$ among the light beams Lg1 to Lgm propagating in the optical waveguide 1, and emit the light Lgk into the optical transmission member 10. If no voltage is applied from the signal processing circuit 90, the optical resonant member 40 in the optical transmission/reception unit 11 does not resonate with any of the light beams Lg1 to Lgm propagating in the optical waveguide 1 and does not emit light into the optical transmission member 10.

As a result, the light beam Lgk with the wavelength λk corresponding to the digital value "1" of the transmit signal propagates to the entire area of the optical transmission member 10. More specifically, in accordance with a series of the digital value "1", the light beam Lgk propagates in the optical transmission member 10 for the period corresponding to the length of the series of the digital value "1." If the digital value "1" and the digital value "0" are aligned alternately, the intermittent light beam Lgk propagates in the optical transmission member 10.

Then, for example, the signal processing circuit 90 of the optical transmission/reception unit 2j may apply the voltage Vk to the optical resonant members 50 and 60. Thus, the optical resonant members 50 and 60 in the optical transmission/reception unit 2j resonate with the light beam Lgk propagating in the optical transmission member 10 and emit the light beam Lgk to the photodetector units 70 and 80, respectively.

The photodetector unit 70 in the optical transmission/reception unit 2j receives a light beam Lgk1 emitted from the optical resonant member 50 and converts the received light beam Lgk1 to a voltage Vout1. Then, the photodetector unit 70 in the optical transmission/reception unit 2j outputs the voltage Vout1 to the signal processing circuit 90. The photodetector unit 80 in the optical transmission/reception unit 2j receives a light beam Lgk2 emitted from the optical resonant member 60 and converts the received light beam Lgk2 to a voltage Vout2. Then, the photodetector unit 80 in the optical transmission/reception unit 2j outputs the voltage Vout2 to the signal processing circuit 90.

In this case, in response to the reception of the light beams Lgk1 and Lgk2, the photodetector units 70 and 80 in the optical transmission/reception unit 2j output the voltages Vout1 and Vout2 constituted by $V_{Lg}$ (>0 V) to the signal processing circuit 90, respectively, for the period of time corresponding to the period when they receive the light beams Lgk1 and Lgk2. Without the reception of the light beams Lgk1 and Lgk2, the photodetector units 70 and 80 output the voltages Vout1 and Vout2 constituted by 0 V to the signal processing circuit 90.

Then, upon receiving the voltages Vout1 and Vout2 constituted by $V_{Lg}$ from the photodetector units 70 and 80, the signal processing circuit 90 in the optical transmission/reception unit 2j calculates the sum Vout of the received voltages Vout1 and Vout2 and converts the calculated sum Vout to the digital value "1." The signal processing circuit 90 in the optical transmission/reception unit 2j converts the sum Vout to the digital value "0" if the sum Vout constituted by 0 V. After that, the signal processing circuit 90 in the optical transmission/reception unit 2j demodulates and processes the converted digital value and receives the signal from the optical transmission/reception unit 11.

The exchange of signals among the other optical transmission/reception units 12 to 1j, 21 to 2j–1, . . . and i1 to ij is performed in the same manner.

Therefore, the optical transmission/reception units 11 to 1j, 21 to 2j . . . and i1 to ij can mutually exchange signals by using the optical transmission member 10 as a shared optical transmission path.

Figure 16:
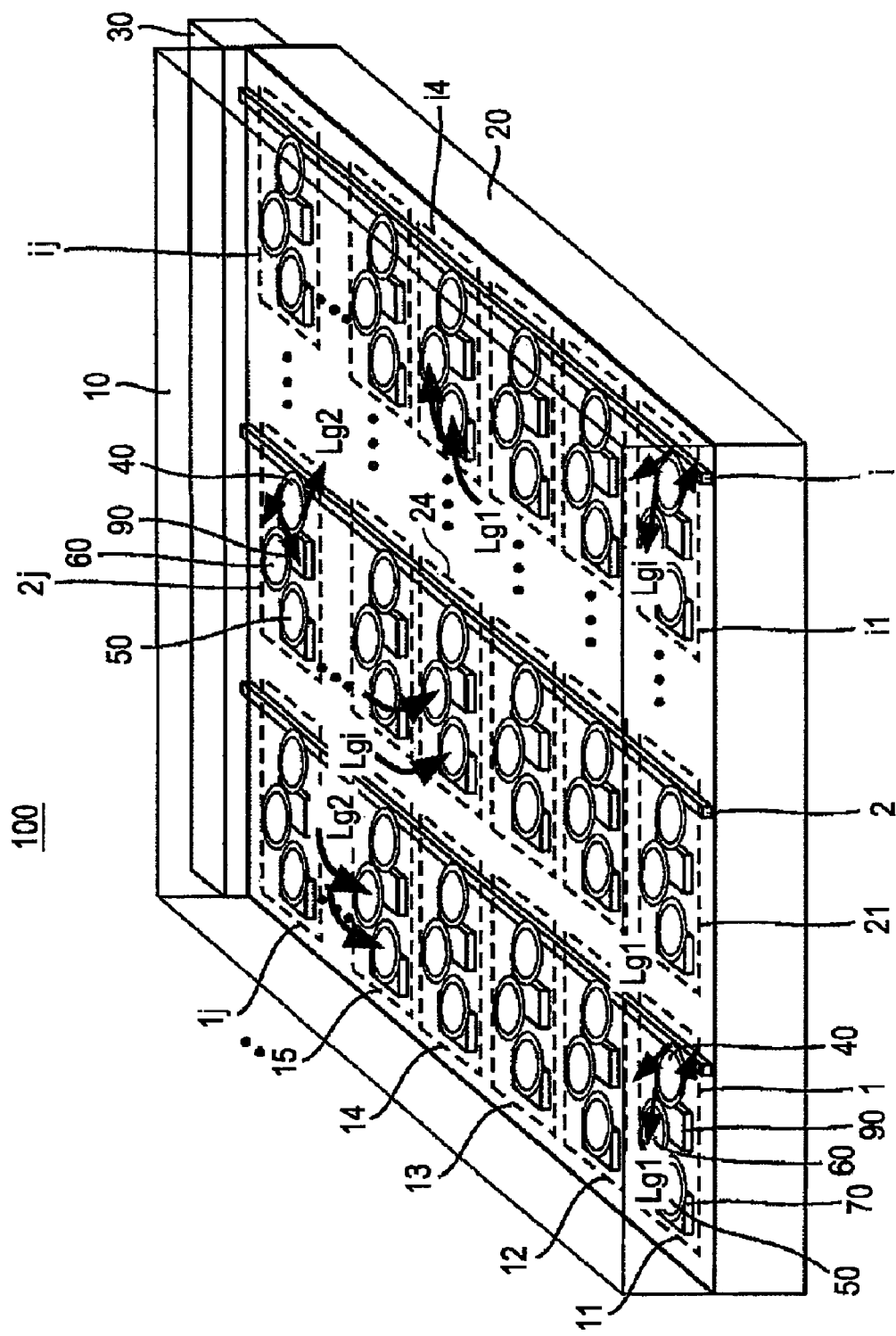
FIG. 16 is a diagram for explaining other exchange of signals in the optical integrated circuit apparatus shown in FIG. 1.

FIG. 16 is a diagram for explaining other exchange of signals in the optical integrated circuit apparatus 100 shown in FIG. 1.

FIG. 16 illustrates a case where the number of the optical waveguides 1 to i is equal to or lower than the number of the light beams Lg1 to Lgm.

It is assumed that the signal processing circuits 90 in optical transmission/reception units that do not transmit a signal sequentially apply voltages V1 to Vi to the optical resonant members 50 and 60 for a certain period of time and receive signals below.

Referring to FIG. 16, the optical transmission/reception units 11 to 1j provided for the optical waveguide 1 transmit and receive signals by applying a voltage V1 to the optical resonant members 40, 50 and 60. The optical transmission/reception units 21 to 2j provided for the optical waveguide 2 transmit and receive signals by applying a voltage V2 to the optical resonant members 40, 50 and 60. The same is true below, and the optical transmission/reception units i1 to ij provided for the optical waveguide i transmit and receive signals by applying a voltage Vi to the optical resonant members 40, 50 and 60.

Under the state that the light beams Lg1 to Lgm emitted from the light source 30 are propagating in the optical waveguides 1 to i, the signal processing circuit 90 in the optical transmission/reception unit 11 applies the voltage V1 to the optical resonant member 40 in accordance with the "1" in the transmit signal if the photodetector units 70 and 80 do not detect the light beam Lg1 by applying the voltage V1 to the optical resonant members 50 and 60, and does not apply voltage to the optical resonant member 40 in accordance with the "0" in the transmit signal.

In response to the application of the voltage V1 from the signal processing circuit 90, the optical resonant member 40 of the optical transmission/reception unit 11 resonates with the light beam Lg1 having the wavelength λ1 of the light beams Lg1 to Lgm propagating in the optical waveguide 1 and emits the light beam Lg1 into the optical transmission member 10. Without the application of voltage from the signal processing circuit 90, the optical resonant member 40 of the optical transmission/reception unit 11 does not resonate with any of the light beams Lg1 to Lgm propagating in the optical waveguide 1 and does not emit light into the optical transmission member 10.

In this way, the optical transmission/reception unit 11 transmits a signal by using the light beam Lg1 having the wavelength λ1.

If the voltage V2 is applied to the optical resonant members 50 and 60 but the photodetector units 70 and 80 do not detect the light beam Lg2, the signal processing circuit 90 in the optical transmission/reception unit 2j applies the voltage V2 to the optical resonant member 40 in accordance with the "1" in the transmit signal and does not apply voltage to the optical resonant member 40 in accordance with "0" in the transmit signal.

In response to the application of the voltage V2 from the signal processing circuit 90, the optical resonant member 40 in the optical transmission/reception unit 2j resonates with the light beam Lg2 having the wavelength λ2 of the light beams Lg1 to Lgm propagating in the optical waveguide 2 and emits the light beam Lg2 into the optical transmission member 10. Without the application of voltage from the signal processing circuit 90, the optical resonant member 40 in the optical transmission/reception unit 2j does not resonate with any of the light beams Lg1 to Lgm propagating in the optical waveguide 2 and does not emit light into the optical transmission member 10.

In this way, the optical transmission/reception unit 2j transmits a signal by using the light beam Lg2 having the wavelength λ2.

If a voltage Vi is applied to the optical resonant members 50 and 60 but the photodetector units 70 and 80 do not detect the light beam Lg1, the signal processing circuit 90 in the optical transmission/reception unit i1 applies the voltage Vi to the optical resonant member 40 in accordance with the "1" in the transmit signal and does not apply voltage to the optical resonant member 40 in accordance with "0" in the transmit signal.

In response to the application of the voltage Vi from the signal processing circuit 90, the optical resonant member 40 in the optical transmission/reception unit i1 resonates with the light beam Lgi having the wavelength λi of the light beams Lg1 to Lgm propagating in the optical waveguide i and emits the light beam Lgi into the optical transmission member 10. Without the application of voltage from the signal processing circuit 90, the optical resonant member 40 in the optical transmission/reception unit i1 does not resonate with any of the light beams Lg1 to Lgm propagating in the optical waveguide i and does not emit light into the optical transmission member 10.

In this way, the optical transmission/reception unit i1 transmits a signal by using the light beam Lgi having the wavelength λi.

The light beams Lg1, Lg2 and Lgi emitted from the optical transmission/reception units 11, 2j and i1 propagate in the optical transmission member 10 in all directions. In this case, because the light beams Lg1, Lg2 and Lgi have different wavelengths from each other, they do not interfere.

For example, if the signal processing circuit 90 in the optical transmission/reception unit i4 applies the voltage V1 to the optical resonant members 50 and 60 for a certain period of time, the optical resonant members 50 and 60 in the optical transmission/reception unit i4 resonate with the light beam Lg1 propagating in the optical transmission member 10 and emits the light beam Lg1 to the photodetector units 70 and 80. Then, the photodetector units 70 and 80 in the optical transmission/reception unit i4 in response to the reception of the light beam Lg1 generate voltages Vout1 and Vout2 constituted by the voltage $V_{Lg}$, respectively, and output them to the signal processing circuit 90. Without the reception of the light beam Lg1, the photodetector units 70 and 80 in the optical transmission/reception unit i4 generate voltages Vout1 and Vout2 constituted by 0V, respectively, and output them to the signal processing circuit 90.

If the voltages Vout1 and Vout2 constituted by the voltage $V_{Lg}$, respectively, are received from the photodetector units 70 and 80, respectively, the signal processing circuit 90 in the optical transmission/reception unit i4 calculates the sum Vout of the received voltages Vout1 and Vout2 and converts the calculated sum Vout to the digital value "1." If the voltages Vout1 and Vout2 constituted by 0V are received from the photodetector units 70 and 80, respectively, the signal processing circuit 90 in the optical transmission/reception unit i4 converts the sum Vout to the digital value "0." Then, the signal processing circuit 90 in the optical transmission/reception unit i4 demodulates and processes the converted digital value and receives the signal.

If the signal processing circuit 90 in the optical transmission/reception unit 15 applies the voltage V2 to the optical resonant members 50 and 60 for a certain period of time, the optical resonant members 50 and 60 in the optical transmission/reception unit 15 resonate with the light beam Lg2 propagating in the optical transmission member 10 and emit the light beam Lg2 to the photodetector units 70 and 80, respectively. Then, the photodetector units 70 and 80 in the optical transmission/reception unit 15 in response to the reception of the light beam Lg2 generate voltages Vout1 and Vout2 constituted by the voltage $V_{Lg}$, respectively, and output them to the signal processing circuit 90. Without the reception of the light beam Lg2, the photodetector units 70 and 80 in the optical transmission/reception unit 15 generate voltages Vout1 and Vout2 constituted by 0V respectively, and output them to the signal processing circuit 90.

If the voltages Vout1 and Vout2 constituted by the voltage $V_{Lg}$ are received from the photodetector units 70 and 80, respectively, the signal processing circuit 90 in the optical transmission/reception unit 15 calculates the sum Vout of the received voltages Vout1 and Vout2 and converts the calculated sum Vout to the digital value "1." If the voltages Vout1 and Vout2 constituted by 0V are received from the photodetector units 70 and 80, the signal processing circuit 90 in the optical transmission/reception unit 15 converts the sum Vout to the digital value "0." Then, the signal processing circuit 90 in the optical transmission/reception unit 15 demodulates and processes the converted digital value and receives the signal.

If the signal processing circuit 90 in the optical transmission/reception unit 24 applies the voltage Vi to the optical resonant members 50 and 60 for a certain period of time, the optical resonant members 50 and 60 in the optical transmission/reception unit 24 resonate with the light beam Lgi propagating in the optical transmission member 10 and emit the light beam Lgi to the photodetector units 70 and 80, respectively. Then, the photodetector units 70 and 80 in the optical transmission/reception unit 24 in response to the reception of the light beam Lgi generate voltages Vout1 and Vout2 constituted by the voltage $V_{Lg}$, respectively, and output them to the signal processing circuit 90. Without the reception of the light beam Lgi, the photodetector units 70 and 80 in the optical transmission/reception unit 24 generate voltages Vout1 and Vout2 constituted by 0V, respectively, and output them to the signal processing circuit 90. If the voltages Vout1 and Vout2 constituted by the voltage $V_{Lg}$ are received from the photodetector units 70 and 80, respectively, the signal processing circuit 90 in the optical transmission/reception unit 24 calculates the sum Vout of the received voltages Vout1 and Vout2 and converts the calculated sum Vout to the digital value "1." If the voltages Vout1 and Vout2 constituted by 0V are received from the photodetector units 70 and 80, respectively, the signal processing circuit 90 in the optical transmission/reception unit 24 converts the sum Vout to the digital value "0." Then, the signal processing circuit 90 in the optical transmission/reception unit 24 demodulates and processes the converted digital value and receives the signal.

In the same manner, the other optical transmission/reception units excluding the optical transmission/reception units 11, 2j, i1, i4, 15 and 24 can exchange signals.

In this way, multiple light beams Lg1, Lg2 and Lgi can be emitted into the optical transmission member 10 simultaneously, whereby signals can also be exchanged.

Figure 17:
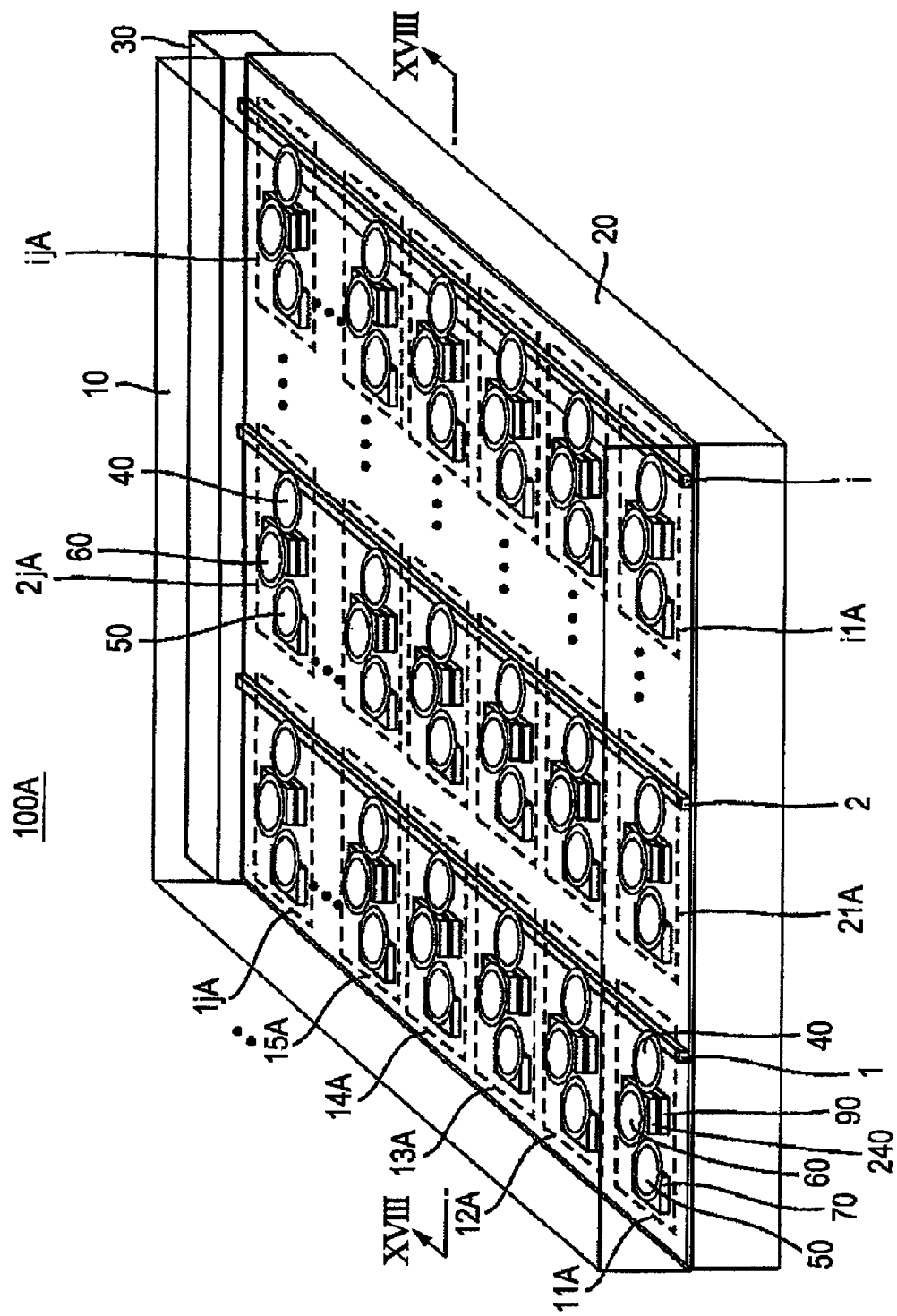
FIG. 17 is a perspective view of another optical integrated circuit apparatus according to a representative embodiment.

FIG. 17 is a perspective view of another optical integrated circuit apparatus according to a representative embodiment. The optical integrated circuit apparatus according to the representative embodiment may be an optical integrated circuit apparatus 100A shown in FIG. 17.

Referring to FIG. 17, the optical integrated circuit apparatus 100A includes optical transmission/reception units 11A to 1jA, 21A to 2jA, ... and i1A to ijA instead of the optical transmission/reception units 11 to 1j, 21 to 2j ... and i1 to ij in the optical integrated circuit apparatus 100 shown in FIG. 1, and the rest of the configuration is the same as those of the optical integrated circuit apparatus 100.

The optical transmission/reception units 11A to 1jA are provided for the optical waveguide 1, and the optical transmission/reception units 21A to 2jA are provided for the optical waveguide 2. In the same manner, the optical transmission/reception units i1A to ijA are provided for the optical waveguide i.

The optical transmission/reception unit 11A further includes a photovoltaic device 240 in addition to the configuration of the optical transmission/reception unit 11 shown in FIG. 2, and the rest is the same as the configuration of the optical transmission/reception unit 11.

Each of the optical transmission/reception units 12A to 1jA, 21A to 2jA, . . . and i1A to ijA has the same configuration as that of the optical transmission/reception unit 11A.

Figure 18:
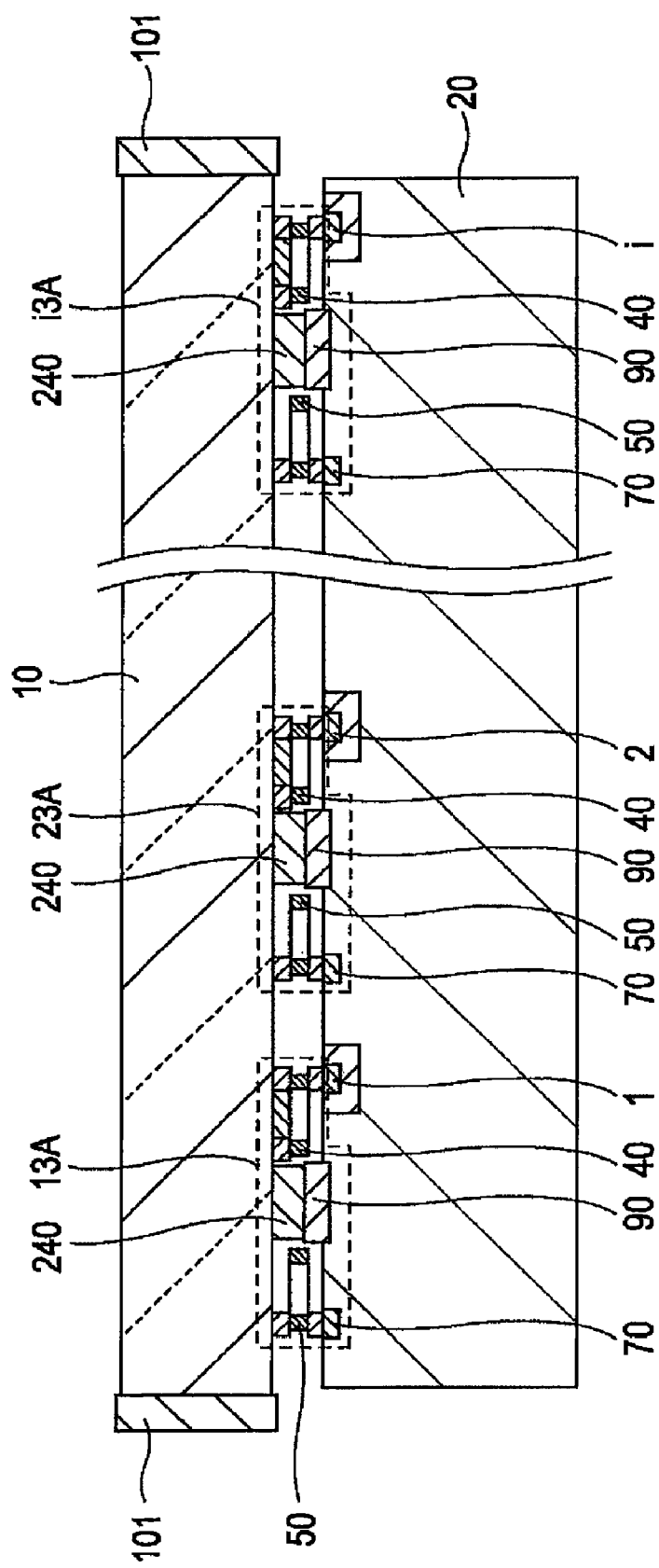
FIG. 18 is a section view of the optical integrated circuit apparatus, which is taken at the line XVIII-XVIII shown in FIG. 17.

FIG. 18 is a section view of the optical integrated circuit apparatus 100A, which is taken at the line XVIII-XVIII shown in FIG. 17. Referring to FIG. 18, in each of the optical transmission/reception units 13A, 23A and i3A, the photovoltaic device 240 is placed on the signal processing circuit 90 in contact with the optical transmission member 10 and electrically is connected to the signal processing circuit 90.

The photovoltaic device 240 includes p-n junction between p-type Si and n-type Si. The photovoltaic device 240 is also placed on the signal processing circuit 90 such that the n-type Si can be in contact with the optical transmission member 10.

Because Si has a higher refractive index than that of SiN constituting the optical transmission member 10, the light propagating to the photovoltaic device 240 enters to the photovoltaic device 240. Then, the photovoltaic device 240 receives the light propagating in the optical transmission member 10, converts the received light to electricity and supplies it to the signal processing circuit 90.

In the optical integrated circuit apparatus 100A, the signal processing circuit 90 operates with the electricity received from the photovoltaic device 240. In other words, in the optical integrated circuit apparatus 100A, the signal processing circuit 90 uses the photovoltaic device 240 as a power supply.

In the optical integrated circuit apparatus 100A, the optical transmission/reception units 11A to 1jA, 21A to 2jA, . . . and i1A to ijA exchange signals with other optical transmission/reception units in the method described with reference to FIGS. 15 and 16.

The photovoltaic device 240 in each of the optical transmission/reception units 11A to 1jA, 21A to 2jA, . . . and i1A to ijA receives the light propagating in the optical transmission member 10, converts the received light to electricity and supplies it to the signal processing circuit 90, irrespective of the reception of light by the photodetector units 70 and 80. In other words, the photovoltaic device 240 in each of the optical transmission/reception units 11A to 1jA, 21A to 2jA, . . . and i1A to ijA receives the light propagating in the optical transmission member 10, converts the received light to electricity and supplies it to the signal processing circuit 90 when other optical transmission/reception units exchange signals even though the signal processing circuit 90 connected to itself does not exchange signals.

Therefore, in the optical integrated circuit apparatus 100A, energy can be saved because the optical transmission/reception units 11A to 1jA, 21A to 2jA, . . . and i1A to ijA convert light being transmitted in the optical transmission member 10 to electricity irrespective of the reception of signals.

The optical integrated circuit apparatus 100A shown in FIGS. 17 and 18 are produced in accordance with the steps in FIGS. 10 to 14. In this case, in the step (1) shown in FIG. 12, after forming the signal processing circuit 90 on the principal plane of the semiconductor substrate 20, p-type Si and n-type Si are sequentially deposited on the signal processing circuit 90 to form the photovoltaic device 240.

Figure 19:
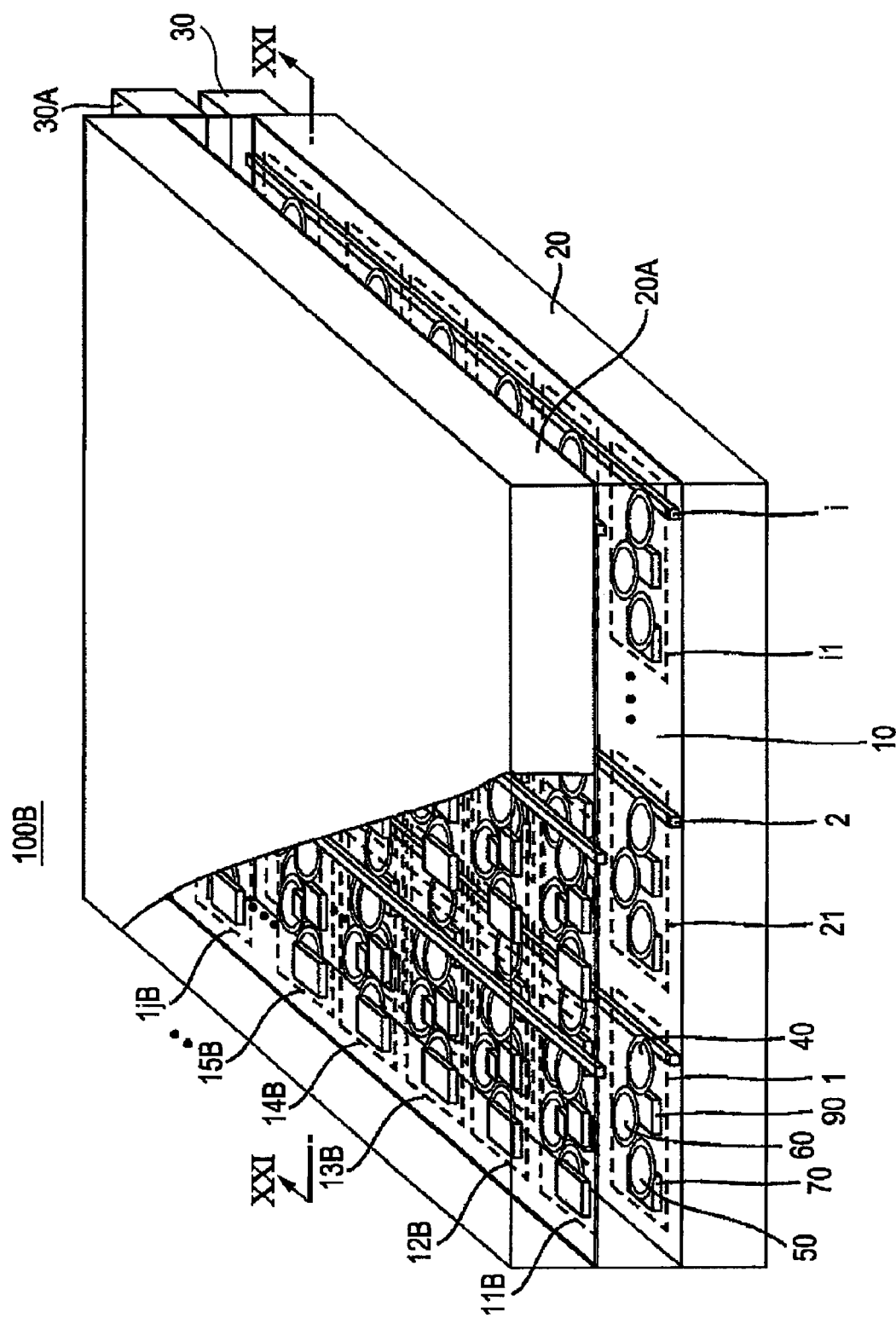
FIG. 19 is a perspective view of still another optical integrated circuit apparatus according to a representative embodiment.
Figure 20:
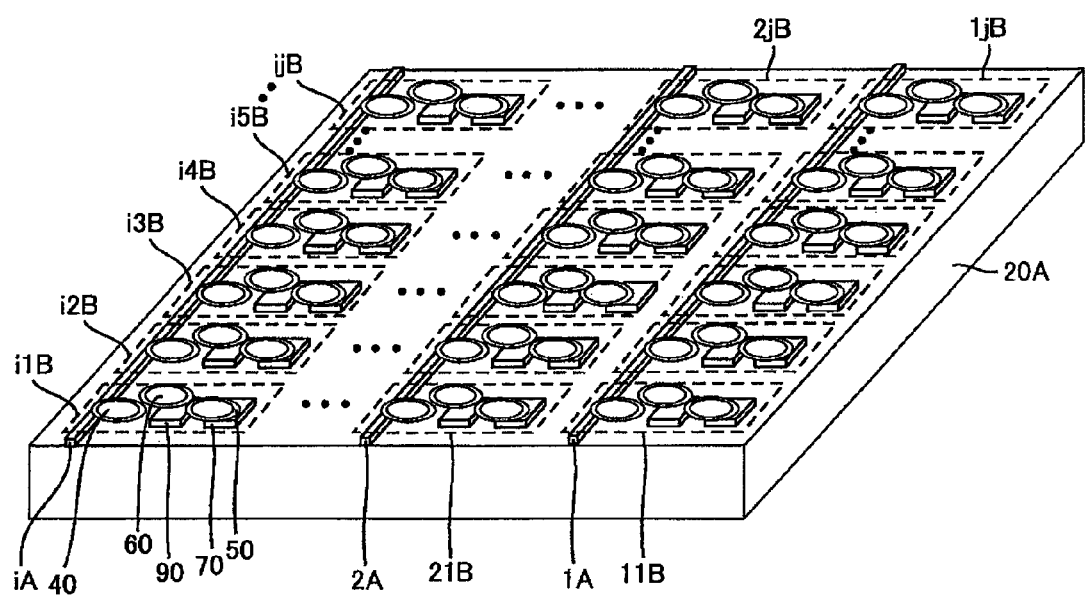
FIG. 20 is a perspective view of the other semiconductor substrate shown in FIG. 19 viewing from the optical transmission member side.
Figure 21:
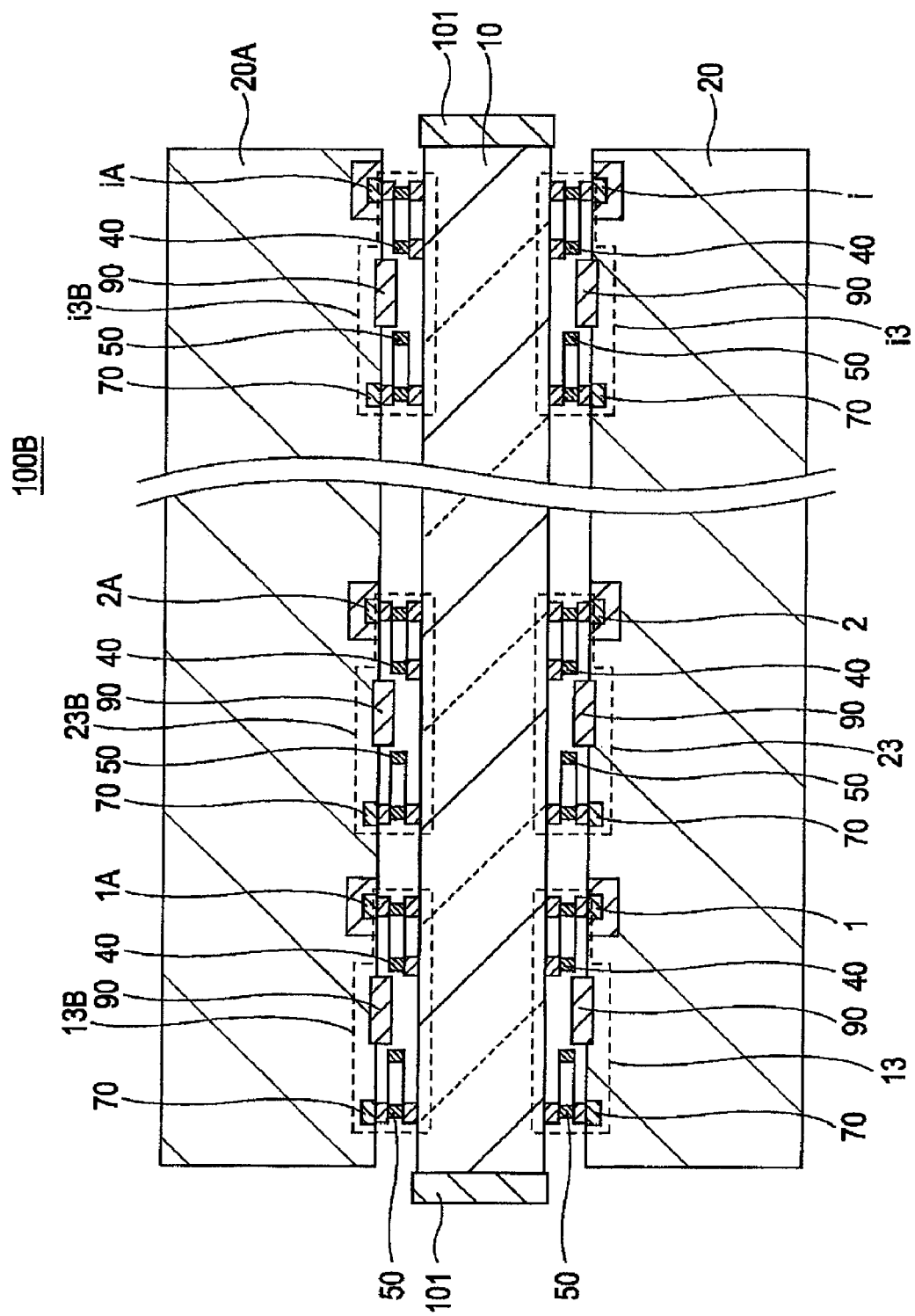
FIG. 21 is a section view of an optical integrated circuit apparatus, which is taken at the line XXI-XXI shown in FIG. 19.

FIG. 19 is a perspective view of still another optical integrated circuit apparatus according to a representative embodiment. FIG. 20 is a perspective view of another semiconductor substrate 20A shown in FIG. 19 viewing from the optical transmission member 10 side. FIG. 21 is a section view of an optical integrated circuit apparatus 100B, which is taken at the line XXI-XXI shown in FIG. 19.

The optical integrated circuit apparatus, according to a representative embodiment, may be the optical integrated circuit apparatus 100B shown in FIGS. 19 to 21. Referring to FIGS. 19 to 21, the optical integrated circuit apparatus 100B further includes the semiconductor substrate 20A, a light source 30A, optical waveguides 1A to iA and optical transmission/reception units 11B to 1jB, 21B to 2jB, . . . and i1B to ijB in addition to the configuration of the optical integrated circuit apparatus 100 shown in FIG. 1, and the rest is the same as the configuration of the optical integrated circuit apparatus 100.

The semiconductor substrate 20A is made of n-type Si and is placed closely to the optical transmission member 10 so as to face the semiconductor substrate 20.

The light source 30A is placed at an end surface of the semiconductor substrate 20A. The optical waveguides 1A to iA are placed on one principal plane of the semiconductor substrate 20A like the optical waveguides 1 to i.

The optical transmission/reception units 11B to 1jB are provided for the optical waveguide 1A, and the optical transmission/reception units 21B to 2jB are provided for the optical waveguide 2A. In the same manner, the optical transmission/reception units i1B to ijB are provided for the optical waveguide iA.

Each of the optical transmission/reception units 11B to 1jB, 21B to 2jB, . . . and i1B to ijB has the same configuration as that of the optical transmission/reception unit 11.

The light source 30A has the same configuration as that of the light source 30 and generates light beams Lg1 to Lgm having wavelengths λ1 to λm or continuous light Lgc having a predetermined wavelength range and supplies the generated light beams Lg1 to Lgm or continuous light Lgc to the optical waveguide 1A to iA.

In the manner as described above, the optical transmission/reception units 11B to 1jB, 21B to 2jB, . . . and i1B to ijB, like the optical transmission/reception units 11 to 1j, 21 to 2j . . . and i1 to ij, emit a part of the light beams Lg1 to Lgm or continuous light Lgc propagating in the optical waveguides 1A to iA into the optical transmission member 10 and receive light in the optical transmission member 10 by the photodetector units 70 and 80 to exchange signals.

In the optical integrated circuit apparatus 100B, signals can be exchanged mutually among the optical transmission/reception units 11 to 1j, 21 to 2j . . . and i1 to ij, and signals can be exchanged mutually among the optical transmission/reception units 11B to 1jB, 21B to 2jB, . . . and i1B to ijB. In the optical integrated circuit apparatus 100B, signals can be exchanged between one of the optical transmission/reception units 11 to 1j, 21 to 2j . . . and i1 to ij placed on one surface side of the optical transmission member 10 and one of the optical transmission/reception units 11B to 1jB, 21B to 2jB, . . . and i1B to ijB placed on the other surface side of the optical transmission member 10.

Therefore, in the optical integrated circuit apparatus 100B, more optical transmission/reception units can be mutually connected than those in the optical integrated circuit apparatus 100 or 100A.

In this way, the optical integrated circuit apparatus 100B has a structure having the optical transmission/reception units 11 to 1j, 21 to 2j . . . and i1 to ij and the optical transmission/reception units 11B to 1jB, 21B to 2jB, . . . and i1B to ijB on two surface sides of the optical transmission member 10.

In the optical integrated circuit apparatus 100B, each of the optical transmission/reception units 11 to 1j, 21 to 2j . . . and i1 to ij and 11B to 1jB, 21B to 2jB, and i1B to ijB may further include the photovoltaic device 240.

Having described that the optical resonant members 40, 50 and 60 are made of an electro-optic material, the optical resonant members 40, 50 and 60 may are made of a magneto-optical material, a thermo-optic material or a material that varies in optical refractive index in accordance with electricity, magnet or a temperature, without limiting thereto. The optical resonant members 40, 50 and 60 may are made of any of $(Ba,Sr)TiO_3$, $LiNbO_3$, $Pb(Zr,Ti)O_3$, $LiTaO_3$, $BaTiO_3$, $K(Ta,Nb)O_3$, $ZnO$, $ADP(NH_4H_2PO_4)$, $KDP(KH_2PO_4)$, YIG $(Y_3Fe_5O_{12})$, $BIG(Bi_3F_5O_{12})$, $GdPr_2F_5O_{12}$, MnBi, GaAs, Ge and Si.

In a case where the optical resonant members 40, 50 and 60 contain a magneto-optical material, the optical resonant wavelength is designed to be equal to the wavelength which is not any of wavelengths that a light source has if no magnetic fields are applied thereto. In other words, the optical resonant wavelength is defined to the wavelength which is not any of the discrete wavelengths if the wavelengths of a light source are discrete. If light having continuous wavelengths in a certain range is used as a light source, the optical resonance wavelength is defined to the wavelength excluding the wavelength range.

In a case where the optical resonant members 40, 50 and 60 are made of a thermo-optic material, the optical resonant wavelength is designed to be equal to the wavelength which is not any of wavelengths that a light source has if no heat is applied thereto. In other words, the optical resonant wavelength is defined to the wavelength which is not any of the discrete wavelengths if the wavelengths of a light source are discrete. If light having continuous wavelengths in a certain range is used as a light source, the optical resonance wavelength is defined to the wavelength excluding the wavelength range.

As described above, in the optical integrated circuit apparatus 100, 100A and 100B, the optical transmission/reception units 11 to 1j, 21 to 2j . . . and i1 to ij, the optical transmission/reception units 11A to 1jA, 21A to 2jA, . . . and i1A to ijA and optical transmission/reception units 11 to 1j, 21 to 2j . . . and i1 to ij and 11B to 1jB, 21B to 2jB, and i1B to ijB exchange signals by using the optical transmission member 10 as a shared optical transmission path.

Therefore, in the representative embodiments, two arbitrary optical transmission/reception units can communicate. The optical transmission/reception units 11 to 1j, 21 to 2j . . . and i1 to ij, the optical transmission/reception units 11A to 1jA, 21A to 2jA, and i1A to ijA and optical transmission/reception units 11 to 1j, 21 to 2j . . . and i1 to ij and 11B to 1jB, 21B to 2jB, . . . and i1B to ijB can be arbitrarily connected through an optical transmission member.

Each of the optical resonant members 40, 50 and 60 constitutes the "optical switch member."

In the representative embodiments, the optical resonant member 40 constitutes the "first optical resonant member", and each of the optical resonant members 50 and 60 constitute the "second optical resonant member."

In the representative embodiments, the j optical resonant members 40 included in the optical transmission/reception units 11 to 1j, the j optical resonant members 40 included in the optical transmission/reception units 21 to 2j . . . and the j optical resonant members 40 included in the optical transmission/reception units i1 to ij constitute the "i first optical resonant member groups."

In the representative embodiments, the j optical resonant members 50 and 60 included in the optical transmission/reception units 11 to 1j, the j optical resonant members 50 and 60 included in the optical transmission/reception units 21 to 2j . . . and the j optical resonant members 50 and 60 included in the optical transmission/reception units i1 to ij constitute the "i second optical resonant member groups."

In the representative embodiments, the j photodetector units 70 and 80 included in the optical transmission/reception units 11 to 1j, the j photodetector units 70 and 80 included in the optical transmission/reception units 21 to 2j . . . and the j photodetector units 70 and 80 included in the optical transmission/reception units i1 to ij constitute the "i photodetector unit groups."

In the representative embodiments, the j signal processing circuits 90 included in the optical transmission/reception units 11 to 1j, the j signal processing circuits 90 included in the optical transmission/reception units 21 to 2j . . . and the j signal processing circuits 90 included in the optical transmission/reception units i1 to ij constitute the "i signal processing circuit groups."

In the representative embodiments, the j optical resonant members 40 included in the optical transmission/reception units 11A to 1jA, the j optical resonant members 40 included in the optical transmission/reception units 21A to 2jA . . . and the j optical resonant members 40 included in the optical transmission/reception units i1A to ijA constitute the "i first optical resonant member groups."

In the representative embodiments, the j optical resonant members 50 and 60 included in the optical transmission/reception units 11A to 1jA, the j optical resonant members 50 and 60 included in the optical transmission/reception units 21A to 2jA . . . and the j optical resonant members 50 and 60 included in the optical transmission/reception units i1A to ijA constitute the "i second optical resonant member groups."

In the representative embodiments, the j photodetector units 70 and 80 included in the optical transmission/reception units 11A to 1jA, the j photodetector units 70 and 80 included in the optical transmission/reception units 21A to 2jA . . . and the j photodetector units 70 and 80 included in the optical transmission/reception units i1A to ijA constitute the "i photodetector unit groups."

In the representative embodiments, the j signal processing circuits 90 included in the optical transmission/reception units 11A to 1jA, the j signal processing circuits 90 included in the optical transmission/reception units 21A to 2jA . . . and the j signal processing circuits 90 included in the optical transmission/reception units i1A to ijA constitute the "i signal processing circuit groups."

In the representative embodiments, the j optical resonant members 40 included in the optical transmission/reception units 11B to 1jB, the j optical resonant members 40 included in the optical transmission/reception units 21B to 2jB . . . and the j optical resonant members 40 included in the optical transmission/reception units i1B to ijB constitute the "i first optical resonant member groups."

In the representative embodiments, the j optical resonant members 50 and 60 included in the optical transmission/reception units 11B to 1jB, the j optical resonant members 50 and 60 included in the optical transmission/reception units 21B to 2jB . . . and the j optical resonant members 50 and 60 included in the optical transmission/reception units i1B to ijB constitute the "i second optical resonant member groups."

In the representative embodiments, the j photodetector units 70 and 80 included in the optical transmission/reception units 11B to 1jB, the j photodetector units 70 and 80 included in the optical transmission/reception units 21B to 2jB . . . and the j photodetector units 70 and 80 included in the optical transmission/reception units i1B to ijB constitute the "i photodetector unit groups."

In the representative embodiments, the j signal processing circuits 90 included in the optical transmission/reception units 11B to 1jB, the j signal processing circuits 90 included in the optical transmission/reception units 21B to 2jB . . . and the j signal processing circuits 90 included in the optical transmission/reception units i1B to ijB constitute the "i signal processing circuit groups."

In the representative embodiments, the 2j optical resonant members 40 included in the optical transmission/reception units 11 to 1j and 1B to 1jB, the 2j optical resonant members 40 included in the optical transmission/reception units 11 to 1j and 21B to 2jB . . . and the 2j optical resonant members 40 included in the optical transmission/reception units 11 to 1j and i1B to ijB constitute the "i first optical resonant member groups."

In the representative embodiments, the 2j optical resonant members 50 and 60 included in the optical transmission/reception units 11 to 1j and 11B to 1jB, the 2j optical resonant members 50 and 60 included in the optical transmission/reception units 11 to 1j and 21B to 2jB . . . and the 2j optical resonant members 50 and 60 included in the optical transmission/reception units 11 to 1j and i1B to ijB constitute the "i second optical resonant member groups."

In the representative embodiments, the 2j photodetector units 70 and 80 included in the optical transmission/reception units 11 to 1j and 11B to 1jB, the 2j photodetector units 70 and 80 included in the optical transmission/reception units 11 to 1j and 21B to 2jB . . . and the 2j photodetector units 70 and 80 included in the optical transmission/reception units 11 to 1j and i1B to ijB constitute the "i photodetector unit groups."

In the representative embodiments, the 2j signal processing circuits 90 included in the optical transmission/reception units 11 to 1j and 11B to 1jB, the 2j signal processing circuits 90 included in the optical transmission/reception units 11 to 1j and 21B to 2jB . . . and the 2j signal processing circuits 90 included in the optical transmission/reception units 11 to 1j and i1B to ijB constitute the "i signal processing circuit groups."

The disclosed embodiments herein are provided for the illustration purpose only, and it should be considered that they are not limitative. It is intended that the scope of the representative embodiments is to be determined solely not by the embodiments described above but by the appended claims and that includes all changes within the equivalent spirit and scope to those of the claims.

The representative embodiments are applicable to an optical integrated circuit apparatus in which two arbitrary optical transmission/reception units can directly communicate. The representative embodiments are also applicable to an optical integrated circuit apparatus in which two arbitrary optical transmission/reception units can communicate with each other at a same time.

What is claimed is:

1. An optical integrated circuit device comprising:
   a light transmission member for transmitting light, the light transmission member being in the form of a flat plate;
   an optical waveguide propagating light emitted from a light source; and
   a plurality of light transmission/reception units transmitting/receiving a signal to/from each other by sharing the light transmission member for use as a light transmission path; wherein
   each of the plurality of light transmission/reception units includes:
     a first optical resonance member formed into the shape of a ring and disposed, in the proximity of the light transmission member and substantially parallel thereto, between the light transmission member and the optical waveguide, the first optical resonance member resonating with light propagating through the optical waveguide when either of a voltage or a magnetic field is applied;
     an optical emission member formed into the same shape as that of the first optical resonance member and disposed between the light transmission member and the first optical resonance member in a manner where contact is made with the first optical resonance member, the optical emission member guiding, to the light transmission member, resonant light propagating through the first optical resonance member;
   a second optical resonance member formed into the shape of a ring and disposed in the proximity of the light transmission member and substantially parallel thereto, the second optical resonance member resonating with light propagating through the light transmission member when either of the voltage or the magnetic field is applied;
     an optical reception member disposed between the light transmission member and the second optical resonance member in a manner where contact is made with the second optical resonance member, the optical reception member guiding, to the second optical resonance member, light propagating through the light transmission member; and
     an optical detection unit detecting resonant light propagating through the second optical resonance member.

2. The optical integrated circuit device according to claim 1, wherein
   the second optical resonance member includes first and second optical resonators disposed away from each other in a planar direction of the light transmission member; wherein
   the optical reception member includes
     a first optical reception member disposed in a manner where contact is made with the first optical resonator and
     a second optical reception member making contact with the second optical resonator and rotated, in a planar direction of the light transmission member, substantially 90 degrees from a position of the first optical reception member; wherein
   the optical detection unit includes:
     a first optical detector detecting resonant light propagating through the first optical resonator; and
     a second optical detector detecting resonant light propagating through the second optical resonator.

3. The optical integrated circuit device according to claim 2, wherein
   each of the plurality of light transmission/reception units further includes a signal processing circuit receiving a signal by calculating the sum of a first output signal output from the first optical detector and a second output signal output from the second optical detector.

4. The optical integrated circuit device according to claim 3, wherein the signal processing circuit further transmits a signal via the light transmission member in response to application or non-application of either of the voltage or the magnetic field to the first optical resonance member.

5. The optical integrated circuit device according to claim 1, wherein
light propagating through the optical waveguide is a plurality of light beams having a plurality of discrete wavelengths or continuous wavelengths in a given range; wherein
when either of the voltage or the magnetic field is applied, the first optical resonance member resonates with one of the plurality of light beams forming light propagating through the optical waveguide, the one of the plurality of light beams having a wavelength.

6. The optical integrated circuit device according to claim 1, wherein
each of the first and second optical resonance members includes an electro-optical material, a magneto-optical material, or a material having an optical refraction index that varies in response to electricity/magnetism.

7. The optical integrated circuit device according to claim 6, wherein
each of the first and second optical resonance members includes any one of $(Ba,Sr)TiO_3$, $LiNbO_3$, $Pb(Zr,Ti)O_3$, $LiTaO_3$, $BaTiO_3$, $K(Ta,Nb)O_3$, $ZnO$, $ADP(NH_4H_2PO_4)$, $KDP(KH_2PO_4)$, $YIG(Y_3Fe_5O_{12})$, $BIG(Bi_3F_5O_{12})$, $GdPr_2F_5O_{12}$, $MnBi$, $GaAs$, $Ge$ and $Si$.

8. The optical integrated circuit device according to claim 1, wherein
the light transmission member includes a transparent material having a refraction index larger than that of air.

9. The optical integrated circuit device according to claim 8, wherein
the light transmission member includes any one of SiN, $SiO_2$, SiON, resist, and plastic.

10. An optical integrated circuit device comprising:
a light transmission member transmitting light, the light transmission member being in the form of a flat plate; and
a semiconductor substrate disposed in the proximity of the light transmission member and substantially parallel thereto; wherein the semiconductor substrate includes:
i (i is a positive integer) optical waveguides propagating light from a light source, the optical waveguides being formed on a main surface on the side of the light transmission member;
i first optical resonance member groups disposed corresponding to the i optical waveguides, each of the first optical resonance group being formed on one optical waveguide in a manner where contact is made with the one optical waveguide;
i optical detection unit groups disposed corresponding to the i optical waveguides;
i second optical resonance member groups disposed corresponding to the i optical waveguides, each of the second optical resonance member group being formed on one optical detection unit group in a manner where contact is made with the one optical detection unit group; and
i signal processing circuit groups disposed corresponding to the i optical waveguides; wherein
each of the i first optical resonance member groups includes:
j (j is 2 or a larger integer) first optical resonance members each formed into the shape of a ring; and
j optical emission members disposed corresponding to the j first optical resonance members, each of the j optical emission members being in the same shape as that of the first optical resonance member and disposed between the light transmission member and the first optical resonance member in a manner where contact is made with the first optical resonance member; wherein
each of the i optical detection unit groups includes j optical detection units; wherein
each of the i second optical resonance member groups includes:
j second optical resonance members each formed into the shape of a ring; and
j optical reception members disposed corresponding to the j second optical resonance members, each of the optical reception members being disposed between the light transmission member and the second optical resonance member in a manner where contact is made with the second optical resonance member; wherein
each of the i signal processing circuit groups includes j signal processing circuits; wherein
when either of a voltage or a magnetic field is applied, each of the j first optical resonance members guides, to the light transmission member via the optical emission member, one of light beams propagating through the optical waveguide, the one of light beams having a wavelength resonating with the first optical resonance member; wherein
when either of a voltage and a magnetic field is applied, each of the j second optical resonance members guides, to the optical detection unit, one of light beams received from the light transmission member via the optical reception member, the one of light beams having a wavelength resonating with the second optical resonance member; wherein
each of the j optical detection units detects a light beam guided by the second optical resonance member; wherein
each of the j signal processing circuits transmits a signal in response to application or non-application of either of a voltage or a magnetic field to the first optical resonance member and processes a detection signal detected by the optical detection unit in response to application or non-application of either of a voltage or a magnetic field to the second optical resonance member.

11. The optical integrated circuit device according to claim 10, wherein
each of the j second optical resonance members includes first and second optical resonators disposed away from each other in a planar direction of the semiconductor substrate; wherein
each of the j optical reception members includes:
a first optical reception member disposed in a manner where contact is made with the first optical resonator; and
a second optical reception member in contact with the second optical resonator and rotated, in a planar direction of the semiconductor substrate, substantially 90 degrees from a position of the first optical reception member; wherein
each of the j optical detection units includes:
a first optical detector detecting resonant light propagating through the first optical resonator; and
a second optical detector detecting resonant light propagating through the second optical resonator.

12. The optical integrated circuit device acceding to claim 11, wherein
each of the j signal processing circuits receives a signal by calculating the sum of a first output signal output from the first optical detector and a second output signal output from the second optical detector.

* * * * *

UNITED STATES PATENT AND TRADEMARK OFFICE
CERTIFICATE OF CORRECTION

PATENT NO. : 7,720,389 B2
APPLICATION NO. : 12/393458
DATED : May 18, 2010
INVENTOR(S) : Yokoyama Page 1 of 1

It is certified that error appears in the above-identified patent and that said Letters Patent is hereby corrected as shown below:

In Column 4, Line 61, in Heading, delete "DESCRIPTION" and insert -- DETAILED DESCRIPTION --, therefor.

In Column 25, Line 1, in Claim 12, delete "acceding" and insert -- according --, therefor.

Signed and Sealed this
Tenth Day of April, 2012

David J. Kappos
*Director of the United States Patent and Trademark Office*